(12) United States Patent
Pio

(10) Patent No.: US 11,335,402 B2
(45) Date of Patent: May 17, 2022

(54) SYSTEMS AND TECHNIQUES FOR ACCESSING MULTIPLE MEMORY CELLS CONCURRENTLY

(71) Applicant: Micron Technology, Inc., Boise, ID (US)

(72) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 243 days.

(21) Appl. No.: 16/712,682

(22) Filed: Dec. 12, 2019

(65) Prior Publication Data

US 2020/0202928 A1 Jun. 25, 2020

Related U.S. Application Data

(60) Provisional application No. 62/782,015, filed on Dec. 19, 2018.

(51) Int. Cl.
*G11C 13/00* (2006.01)

(52) U.S. Cl.
CPC ........ *G11C 13/003* (2013.01); *G11C 13/0004* (2013.01); *G11C 13/004* (2013.01); *G11C 13/0061* (2013.01); *G11C 13/0069* (2013.01); *G11C 2013/0045* (2013.01)

(58) Field of Classification Search
CPC . G11C 13/003; G11C 13/0004; G11C 13/004; G11C 13/0061; G11C 13/0069; G11C 2013/0045
USPC ......................................................... 365/163
See application file for complete search history.

(56) References Cited

U.S. PATENT DOCUMENTS

| | | | |
|---|---|---|---|
| 9,799,381 B1 * | 10/2017 | Tortorelli | G11C 13/0069 |
| 10,269,442 B1 * | 4/2019 | Tortorelli | H01L 27/2463 |
| 2011/0096611 A1 | 4/2011 | Lee et al. | |
| 2016/0276023 A1 | 9/2016 | Chen et al. | |
| 2017/0125097 A1 * | 5/2017 | Tortorelli | G11C 13/0069 |
| 2018/0040370 A1 * | 2/2018 | Tortorelli | G11C 13/0069 |
| 2018/0102149 A1 | 4/2018 | Tortorelli et al. | |
| 2018/0122472 A1 * | 5/2018 | Pirovano | G11C 13/0026 |
| 2018/0277208 A1 | 9/2018 | Kamalanathan et al. | |
| 2018/0315474 A1 | 11/2018 | Redaelli et al. | |

OTHER PUBLICATIONS

ISA/KR, International Search Report and Written Opinion of the International Searching Authority, Int'l Appl. No. PCT/US2019/066202, dated Apr. 17, 2020, Korean Intellectual Property Offce, Seo-gu, Daejeon, Republic of Korea, 14 pgs.

* cited by examiner

*Primary Examiner* — Ly D Pham
(74) *Attorney, Agent, or Firm* — Holland & Hart LLP

(57) ABSTRACT

Techniques are provided for accessing two memory cells of a memory tile concurrently. A memory tile may include a plurality of self-selecting memory cells addressable using a row decoder and a column decoder. A memory controller may access a first self-selecting memory cell of the memory tile using a first pulse having a first polarity to the first self-selecting memory cell. The memory controller may also access a second self-selecting memory cell of the memory tile concurrently with accessing the first self-selecting memory cell using a second pulse having a second polarity different than the first polarity. The memory controller may determine characteristics of the pulses to mitigate disturbances of unselected self-selecting memory cells of the memory tile.

14 Claims, 17 Drawing Sheets

SYSTEMS AND TECHNIQUES FOR ACCESSING MULTIPLE MEMORY CELLS CONCURRENTLY

CROSS REFERENCE

The present Application for Patent claims priority to U.S. Provisional Patent Application No. 62/782,015 by Pio, entitled "SYSTEMS AND TECHNIQUES FOR ACCESSING MULTIPLE MEMORY CELLS CONCURRENTLY," filed Dec. 19, 2018, which is assigned to the assignee hereof and which is expressly incorporated by reference in its entirety.

BACKGROUND

The following relates generally to programming enhancement in memory cells and more specifically to programming enhancement in self-selecting memory.

Memory devices are widely used to store information in various electronic devices such as computers, wireless communication devices, cameras, digital displays, and the like. Information is stored by programing different states of a memory device. For example, binary devices have two states, often denoted by a logic '1' or a logic '0'. In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Some memory devices may include a plurality of memory tiles which comprise an array of memory cells. Each memory tile may include a single row decoder and a single column decoder, which may be used to access memory cells of the memory tile. In some memory tiles, only a single memory cell may be accessed during an access operation.

DETAILED DESCRIPTION

Some memory cells may be formed of a chalcogenide material that causes ions to migrate or crowd toward one side of the chalcogenide material when a voltage is applied. These memory cells, sometimes referred to as self-selecting memory cells, may leverage the ion migration or crowding to store a logic state (e.g., a logic '0' or a logic '1') on the memory cell. Due to the nature of the chalcogenide material, self-selecting memory cells may be programmed using programming pulses of different polarities and self-selecting memory cells may be read using read pulses of different polarities. In many memory tiles, only a single memory cell is addressable at a time, which leads to disadvantages and limitations. The use of different polarities in the access pulses may provide some advantages in the functioning of a memory device that includes self-selecting memory cells.

Techniques are provided for accessing multiple memory cells of a memory tile concurrently. A memory tile may include a plurality of self-selecting memory cells addressable using a row decoder and a column decoder. To access a first self-selecting memory cell of the memory tile, a memory controller may apply a first pulse having a first polarity to the first self-selecting memory cell. The memory controller may also access a second self-selecting memory cell of the memory tile concurrently with accessing the first self-selecting memory cell using a second pulse having a second polarity that is different than the first polarity. The memory controller may determine characteristics of the first pulse and second pulse to mitigate disturbances of unselected self-selecting memory cells of the memory tile. In such memory tiles, two self-selecting memory cells may be read concurrently or two self-selecting memory cells may be programmed concurrently or a self-selecting memory cell may be read and another self-selecting memory cell may be programmed concurrently.

Figure 1:
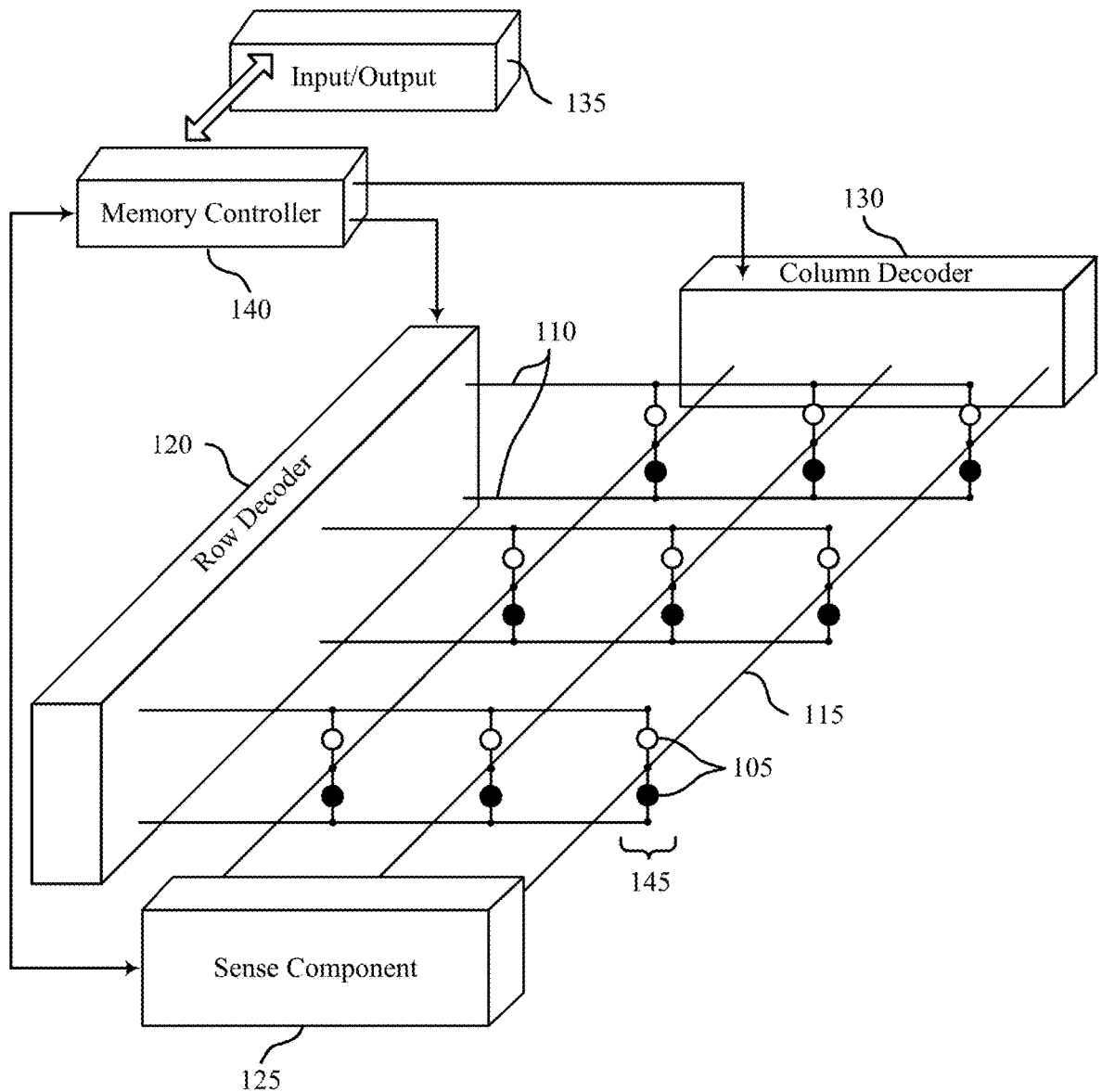
FIG. 1 illustrates an example memory array that supports systems and techniques for accessing multiple memory cells concurrently in accordance with various examples of the present disclosure.

FIG. 1 illustrates an example of a memory tile 100 that supports systems and techniques for accessing multiple memory cells concurrently in accordance with various examples of the present disclosure. A memory device may include a plurality of memory tiles 100. The memory tile 100 includes memory cells 105 that are programmable to store different states. Each memory cell 105 may be programmable to store two states, denoted a logic '0' and a logic '1'. In some cases, memory cell 105 is configured to store more than two logic states.

The memory tile 100 may represent a block of memory cells that are addressable during an access operation. The memory tile 100 may include a row decoder 120 and column decoder 130 for addressing the selected memory cell of the memory tile 100 during an access operation. In some memory technologies, only a single memory cell 105 of a memory tile 100 is accessible at a time. This is due to disturbances on unselected memory cells that may occur if a plurality of access lines (e.g., word lines 110 and/or digit lines 115) are biased during the same access operation. Systems and techniques are provided herein for accessing two or more memory cells 105 of the same memory tile 100 during concurrently during the same access operation duration.

The memory tile 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory tile 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110 and an access line 115. Access lines 110 may also be known as word lines 110, and digit lines 115, respectively. Digit lines 115 may also be known digit lines 115. References to word lines and digit lines, or their analogues, are interchangeable without loss of understanding or operation. Word lines 110 and digit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible; for example, memory cell 105 may be asymmetrically shaped, such as memory cell 105-c with reference to FIG. 3.

In general, one memory cell 105 may be located at the intersection of two conductive lines such as a word line 110 and a digit line 115. This intersection may be referred to as a memory cell's address. A target memory cell 105 (i.e., a selected memory cell) may be a memory cell 105 located at the intersection of an energized word line 110 and digit line 115; that is, a word line 110 and digit line 115 may be energized in order to read or write a memory cell 105 at their intersection. Other memory cells 105 that are in electronic communication with (e.g., connected to) the same word line 110 or digit line 115 may be referred to as untargeted memory cells 105. In some memory tiles, only a single memory cell 105 may be targeted during an access operation due to disturbances that may occur on other non-targeted memory cells 105 of the memory tile 100. In the present disclosure, systems and techniques are discussed for targeting two or more memory cells of the memory tile 100 during a single access operation duration.

As discussed above, electrodes may be coupled to a memory cell 105 and a word line 110 or a digit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory tile 100.

Operations such as reading and writing may be performed on memory cells 105 by activating or selecting a word line 110 and digit line 115, which may include applying a voltage or a current to the respective line (e.g., a read pulse). Word lines 110 and digit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, selenium (Se) ions may be leveraged to set a logic state of the cell. Additionally or alternatively, ions of other conductive materials may migrate in addition to or in replace of selenium (Se) ions.

For example, a memory cell may be programmed by providing an electric pulse to the memory cell 105 (e.g., programming pulse), which may include a memory storage element that includes selenium. The programming pulse may be provided via a first access line (e.g., word line 110) or a second access line (e.g., digit line 115), for example. Upon providing the programming pulse, ions may migrate within the memory storage element, depending on the polarity of the programming pulse and/or a current state of the memory cell 105. Thus, a concentration of ions and/or selenium relative to the first side or the second side of the memory storage element may be based at least in part on a polarity and/or magnitude of a voltage applied to the memory storage element by the first access line and the second access line. In some cases, the memory storage element may have an asymmetrical shape. Such an asymmetrical shape may cause ions to be more crowded at one portion of the memory storage element over another portion of the memory storage element.

To read the cell, a voltage (e.g., read pulse) may be applied across memory cell 105 and the resulting current or the threshold voltage at which current begins to flow may be representative of a logic '1' or a logic '0' state. The crowding of selenium ions at one or the other ends of memory storage element may affect the resistivity and/or the threshold voltage, resulting in greater distinctions in cell response between logic states.

Accessing the memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing the memory cell 105. The signal may include a voltage or electrical current, and sense component 125 may include voltage sense amplifiers, current sense amplifiers, or both. For example, a voltage may be applied to a memory cell 105 (using the corresponding word line 110 and digit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and digit line 115—i.e., a logic value may be stored in the memory cell 105. Column decoder 130 or row decoder 120 may accept data, for example input/output 135, to be written to the memory cells 105. In the case of self-selecting memory, a memory cell 105 may be written (or programmed) by passing a current through the memory storage element. Depending on the logic state written to memory cell 105 (e.g., logic '1' or logic '0') selenium ions may crowd at or near a particular electrode in contact with the memory storage element. For example, based on the polarity of memory cell 105, ion crowding at or near a first electrode may result in a first threshold voltage representative of a logic '1' state and ion crowding at or near a second electrode may result in a second threshold voltage, different from the first, representative of a logic '0' state. The difference between the first and second threshold voltages may be more pronounced in a memory storage element that is asymmetric, including those described with reference to FIG. 3.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or self-selecting memory, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory tile 100. For example, it may apply discharge voltages to a word line 110 or digit line 115 after accessing one or more memory cells 105.

In general, the amplitude, shape, polarity, or duration of an applied voltage or current discussed herein may be adjusted or varied and may be different for the various operations discussed in operating the memory tile 100. Furthermore, one, multiple, or all memory cells 105 within memory tile 100 may be accessed simultaneously; for example, multiple or all cells of memory tile 100 may be accessed simultaneously during a reset operation in which all memory cells 105, or a group of memory cells 105, are set to a single logic state.

Figure 2:
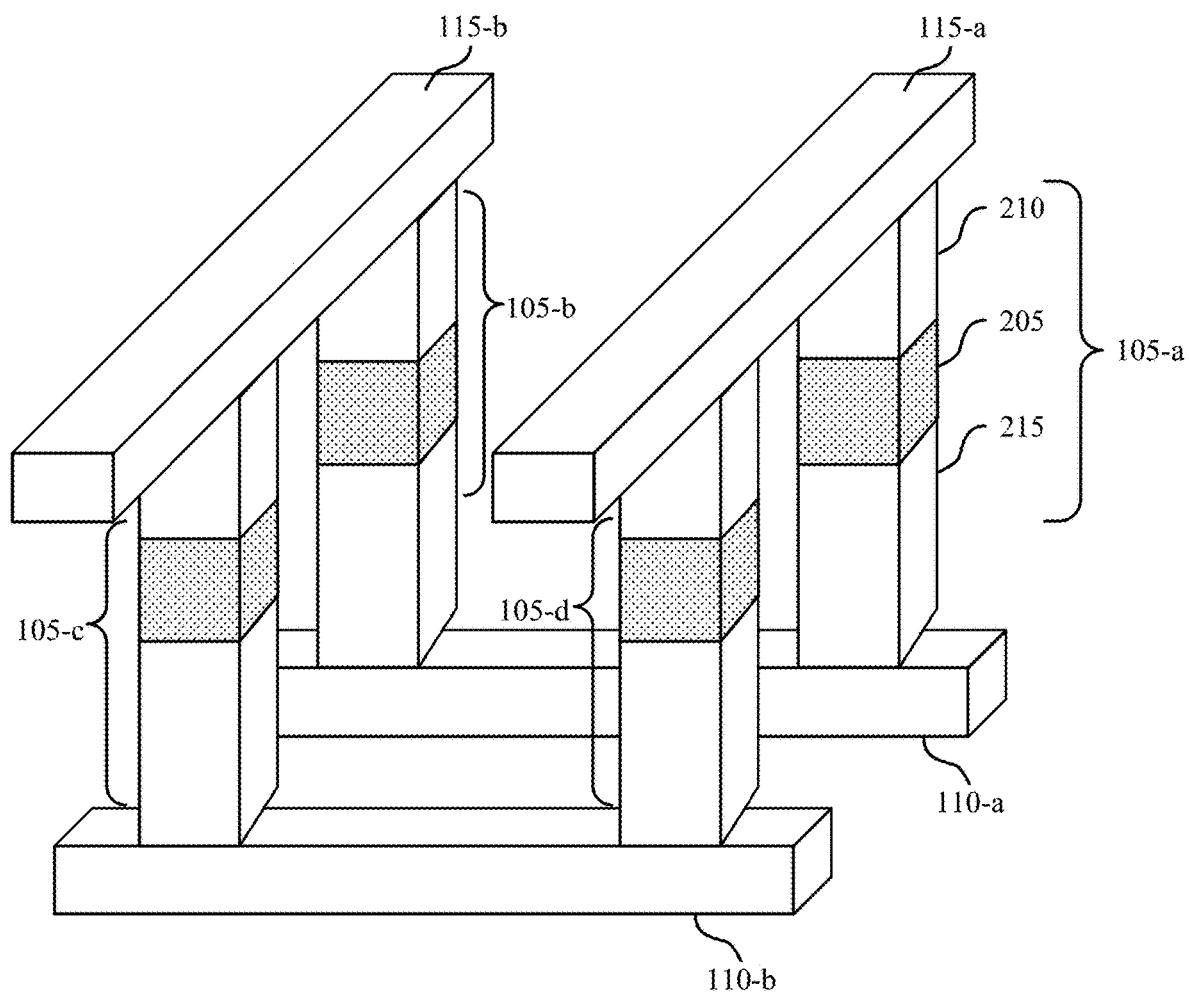
FIG. 2 illustrates an example memory array that supports systems and techniques for accessing multiple memory cells concurrently in accordance with various examples of the present disclosure.

FIG. 2 illustrates an example memory array 200 that supports systems and techniques for accessing multiple memory cells concurrently in accordance with various examples of the present disclosure. Memory array 200 may be an example of memory tile 100 described with reference to FIG. 1.

The memory array 200 may include a plurality of memory cells 105-*a*, 105-*b*, etc. a plurality of word lines 110-*a*, 110-*b*, and a plurality of digit lines 115-*a*, 115-*b*, which may be examples of a memory cell 105, word line 110, and digit line 115 described with reference to FIG. 1. A memory cell 105-*a* may include a top electrode 210, a bottom electrode 215, and memory storage element 205, which may be referred to as a chalcogenide memory component. In some cases, the memory cell 105-*a* may be an example of a self-selecting memory cell.

The architecture of memory array 200 may be referred to as a cross-point architecture. It may also be referred to as a pillar structure. For example, as shown in FIG. 2, a pillar may be in contact with a first conductive line (e.g., access line such as word line 110-*a*) and a second conductive line (e.g., access line such as digit line 115-*a*). The pillar may comprise memory cell 105-*a*, where memory cell 105-*a* includes a first electrode (e.g., top electrode 210), memory storage element 205, and a second electrode (e.g., bottom electrode 215). Memory storage element 205 may be an asymmetrical shape. This asymmetrical shape may cause ion crowding at the top electrode 210 or bottom electrode 215, depending on the polarity of memory cell 105-*a*. Ion crowding at top electrode 210 or bottom electrode 215 may allow for more-accurate sensing of memory cell 105-*a*, as described above.

The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

Memory storage element 205 may, in some cases, be connected in series between a first conductive line and a second conductive line, for example, between word line 110-a and digit line 115-a. The memory storage element 205 may be located between top electrode 210 and bottom electrode 215; thus, memory storage element 205 may be located in series between digit line 115-a and word line 110-a. Other configurations are possible.

The memory storage element 205 may include a chalcogenide material, which may be referred to as a chalcogenide memory component. The chalcogenide memory component may be configured to use a non-uniform distribution of ions to indicate the logic state stored in the memory cell 105-a. The threshold voltage of the chalcogenide memory component may be variable based on a polarity of a pulse used to program the memory cell 105-a. For example, a self-selecting memory cell programmed with a first polarity pulse (e.g., a positive polarity) may have certain resistive and/or electrical properties and thus a first threshold voltage, while a self-selecting memory cell programmed with a second polarity pulse (e.g., a negative polarity) may have different resistive and/or electrical properties and thus a second threshold voltage. These electrical features of the chalcogenide material may be caused by differences in ion migration that occurs based on the characteristics of the programming pulse, including the polarity, magnitude, and/or shape of the programming pulse.

For example, ions may migrate towards a particular electrode, depending on the polarity of the programming pulse applied to a given memory cell. The logic state stored in the memory cell may be based on the distribution of ions in the chalcogenide memory component.

Cell programming may exploit the crystalline structure or atomic configuration of the chalcogenide memory component to achieve different logic states. For example, a material with a crystalline or an amorphous atomic configuration may exhibit different electrical properties based on differences in programming pulses applied to the material. The chalcogenide memory component may have at least two states.

In some cases, chalcogenide memory component may a set state and a reset state. The set state may exhibit a low electrical resistance and may, in some cases, be referred to as the crystalline state. The reset state may exhibit a high electrical resistance and may be referred to as an amorphous state. A voltage (e.g., a programming pulse) applied to the memory cell 105-a may thus cause the memory storage element 205 to enter or maintain a certain state (e.g., a set state or a reset state). The magnitude and the polarity of the applied voltage (e.g., programming pulse) may affect the distribution of ions and thus may affect the logic state stored in the memory cell 105-a that includes the memory storage element 205 formed using chalcogenide material.

Each state of the memory storage element 205 may have a threshold voltage associated with it—that is, current flows after the threshold voltage is exceed. Thus, if the applied voltage is less than the threshold voltage, current may not flow through the memory storage element 205. In some cases, one of the states of the memory storage element 205 may not have a threshold voltage (i.e., a threshold voltage of zero) and, thus, a current may flow in response to the applied voltage. In some cases, the memory storage element 205 may have more than two states that may result in a plurality of different resistances and a plurality of threshold voltages. In such cases, the memory cell 105-a may be configured to have more than three states and may be configured to store more than one bit of digit logic data.

In some cases, the memory storage element 205 may be configured in an asymmetrical shape to facilitate ion crowding at or near top electrode 210 or bottom electrode 215. For example, memory storage element 205 may be in the shape of a trapezoidal prism and a cross-section of memory storage element 205 may include a trapezoid. Alternatively, memory storage element 205 may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base. Memory storage element 205 may be arranged in a series configuration between the first access line 110-a and second access line 115-a. Memory storage element 205 may include a first chalcogenide glass comprising selenium. In some examples, memory storage element 205 comprises a composition of at least one of selenium, arsenic (As), tellurium (Te), silicon (Si), germanium (Ge), or antimony (Sb). When a voltage is applied across the memory storage element 205 (or when there is a voltage difference between top electrode 210 and bottom electrode 215, ions may migrate toward one or the other electrode. For example, Te and Se ions may migrate towards a positive electrode and Ge and As ions may migrate toward a negative electrode. Memory storage element 205 may also serve as a selector device. This type of memory architecture may be an example of self-selecting memory technology.

Figure 3:
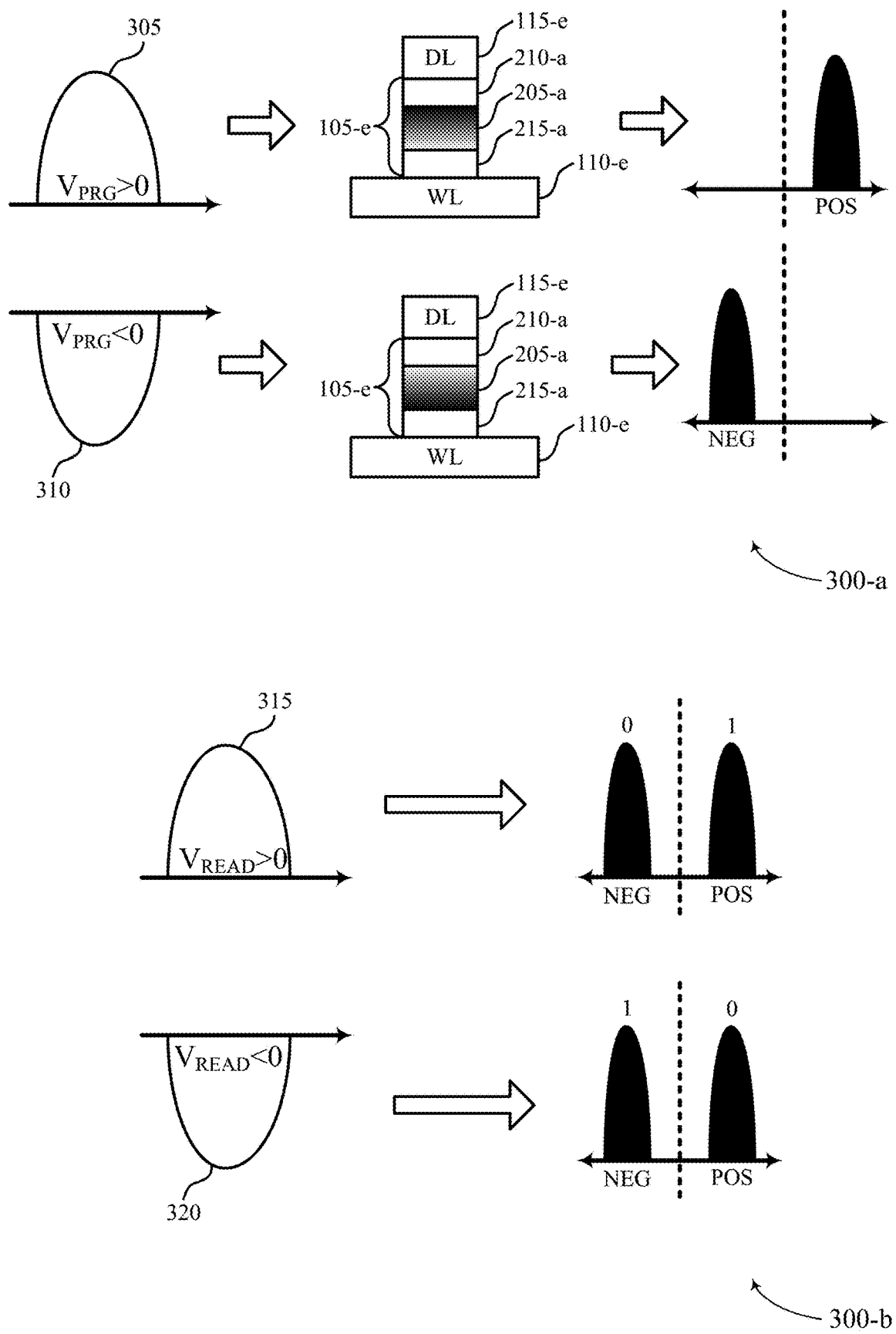
FIG. 3 illustrates examples of diagrams that support systems and techniques for accessing multiple memory cells concurrently in accordance with various examples of the present disclosure.

FIG. 3 illustrates examples of diagrams 300 that support systems and techniques for accessing multiple memory cells concurrently in accordance with various examples of the present disclosure. The diagrams 300 may illustrate the effects of different polarities of programming pulses and different polarities of read pulses on a memory cell 105-e that includes a chalcogenide material. The memory cell 105-e may include a memory storage element 205-a, a top electrode 21-a, a bottom electrode 215-a. The memory cell 105-e may be coupled with a word lines 110-e and a digit line 115-e.

Diagram 300-a illustrates the effects of programming pulses that have different polarities on the memory cell 105-e. If a first programming pulse 305 having a positive polarity (e.g., total voltage across the memory cell 105-e is greater than zero) is applied to the memory cell 105-e, the ions in the memory storage element 205-a may crowd near the interface of the memory storage element 205-a and the top electrode 210-a. The first programming pulse 305 may generate a non-uniform distribution of an element (e.g., ions or selenium or selenium ions) in the memory storage element 205-a with the element concentration being proximal to the top electrode 210-a. To generate the first programming pulse 305 having the positive polarity, a first voltage may be applied to the digit line 115-e and a second voltage less than the first voltage may be applied to the word line 110-e.

If a second programming pulse 310 having a negative polarity (e.g., total voltage across the memory cell 105-*e* is less than zero) is applied to the memory cell 105-*e*, the ions in the memory storage element 205-*a* may crowd near the interface of the memory storage element 205-*a* and the bottom electrode 215-*a*. The second programming pulse 310 may generate a non-uniform distribution of an element (e.g., ions or selenium or selenium ions) in the memory storage element 205-*a* with the element concentration being proximal to the bottom electrode 215-*a*. To generate the second programming pulse 310 having the negative polarity, a first voltage may be applied to the word line 110-*e* and a second voltage less than the first voltage may be applied to the digit line 115-*e*.

Diagram 300-*b* illustrates the effects of read pulses that have different polarities on the memory cell 105-*e*. When reading the memory cell 105-*e* the logic state identified by a memory controller as being stored in the memory cell 105-*e* may be based on the distribution of an element in the memory storage element 205-*a* and the polarity of the read pulse being applied during the read operation.

For example, a memory controller may apply a first read pulse 315 having a positive polarity (e.g., total voltage across the memory cell 105-*e* is greater than zero) to the memory cell 105-*e* as part of a read operation. The logic state identified by a memory controller as being stored in the memory cell 105-*e* may be based on the distribution of ions in the memory cell. If the memory cell 105-*e* was programmed with a positive polarity programming pulse (e.g., first programming pulse 305), the memory controller may determine that a logic '1' is stored on the memory cell 105-*e*. However, if the memory cell 105-*e* was programmed with a negative polarity programming pulse (e.g., second programming pulse 310), the memory controller may determine that a logic '0' is stored on the memory cell 105-*e*.

Such a phenomenon may occur because of how distribution of ions in the memory storage element 205-*a* interacts with the applied pulses. If the positive voltage of the read pulse is applied to the electrode (e.g., top electrode 210 or bottom electrode 215) nearest the concentration of ions, the memory controller may detect a large amount of charge or a high resistivity. The memory controller may identify the high amount of charge as a logic '1.' If the positive voltage of the read pulse is applied to the electrode (e.g., top electrode 210 or bottom electrode 215) farthest away from the concentration of ions, the memory controller may detect a low amount of charge or a low resistivity. The memory controller may identify the low amount of charge as a logic state '0.'

The same principles may apply when a second read pulse 320 having a negative polarity (e.g., total voltage across the memory cell 105-*e* is less than zero) is applied to the memory cell 105-*e* as part of a read operation. The logic state identified by a memory controller as being stored in the memory cell 105-*e* may be based on the distribution of ions in the memory cell. If the memory cell 105-*e* was programmed with a positive polarity programming pulse (e.g., first programming pulse 305), the memory controller may determine that a logic '0' is stored on the memory cell 105-*e*. However, if the memory cell 105-*e* was programmed with a negative polarity programming pulse (e.g., second programming pulse 310), the memory controller may determine that a logic '1' is stored on the memory cell 105-*e*.

In some cases, the memory controller may be configured to invert data before it is output to a host device. To correctly identify a logic state stored on a self-selecting memory cell, the memory controller may need to know the distribution of ions in the memory storage element. One way to identify the distribution of ions is to know the polarity of the programming pulse used to program the self-selecting memory cell. In some instances, the memory controller may identify the polarity of the programming pulse used to program the self-selecting memory cell and the read pulse to read the self-selecting memory cell. The memory controller may identify the logic state stored on the self-selecting memory cell based on both the polarity of the programming pulse and the polarity of the read pulse. In some instances, the polarity of pulses applied to a specific memory cell of the memory tile may be statically or semi-statically configured. If the polarity of pulses to the specific memory cell are dynamically configured, the memory controller may perform additional operations to identify the polarities.

A memory controller may be configured to leverage the ability of a self-selecting memory cell to be accessed using pulses of multiple polarities to concurrently access to memory cells on the same memory tile at the same time. The voltages applied to the access lines for each memory cell access during a single access operation duration may be configured such that a voltage applied to the unselected memory cells of the memory tile does not exceed the programming threshold, a read threshold, or some other disturbance threshold of the unselected memory cells. In effect, the voltages applied to the different access lines during the access operation may be configured such that they negatively interfere with each for unselected cells but constructively interfere with each for selected memory cells on the memory tile.

Figure 4:
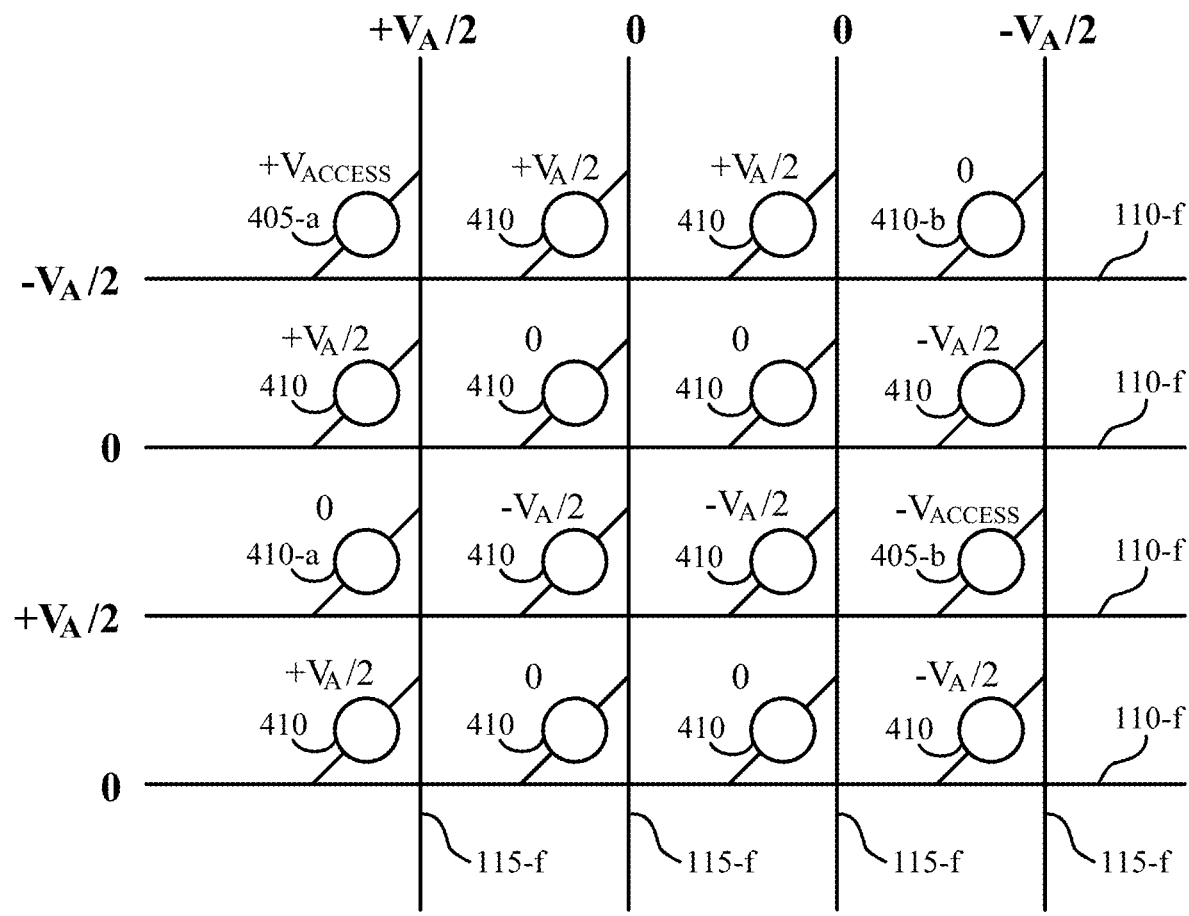
FIG. 4 illustrates an example of a memory tile that supports systems and techniques for accessing multiple memory cells concurrently in accordance with various examples of the present disclosure.

FIG. 4 illustrates an example of a memory tile 400 that supports systems and techniques for accessing multiple memory cells concurrently in accordance with various examples of the present disclosure. Specifically, FIG. 4 illustrates two memory cells on the memory tile 400 being accessed concurrently using the same type of access operation during the same access operation duration. For example, any two memory cells in the memory tile 400 may be read concurrently or any two memory cells in the memory tile 400 may be programmed concurrently.

The memory tile 400 includes a plurality of memory cells 405, 410, a plurality of word lines 110-*f*, and a plurality of digit lines 115-*f*. The memory tile 400 illustrates how a first selected memory cell 405-*a* may be accessed (e.g., read or write) using a first pulse having a first polarity and a second selected memory cell 405-*b* may be accessed (e.g., read or write) using a second pulse having a second polarity different from the first polarity, where the selected memory cells 405 are accessed (e.g., read or written) concurrently. The memory tile 400 may also include a plurality of unselected memory cells 410. The memory cells 405, 410 may be examples of the memory cells 105 described with reference to FIGS. 1-3.

The memory controller (not shown) associated with the memory tile 400 may identify the first selected memory cell 405-*a* and the second selected memory cell 405-*b* to access concurrently using a read operation or a write operation during a single access operation duration. In many memory architectures, only a single memory cell may be accessed during the single access operation duration.

The memory controller may select the polarity of the pulses (e.g., a two read pulses or two programming pulses) to be applied to apply to the selected memory cells 405. The specific polarity of the pulses for each selected memory cell may be selected based on a variety of factors, which may include the location of the selected memory cells 405, the distribution of ions of the selected memory cells 405, the characteristics (e.g., polarity and other characteristics) of the programming pulse used to program the selected memory cells 405, 405-b, or a combination thereof. The memory controller may determine that each selected memory cell 405, 405-b is to be accessed (e.g., read or write) using a different polarity of pulse. For example, if the first selected memory cell 405-a is to be read with a positive polarity read pulse, then memory controller may determine that the second selected memory cell 405-b is to be read with a negative polarity read pulse. In another example, if the first selected memory cell 405-a is to be programmed with a positive polarity programming pulse, then the memory controller may determine that the second selected memory cell 405-b is to be programmed with a negative polarity programming pulse.

The memory controller may control the biasing of the word lines 110-f and the biasing of the digit lines 115-f to achieve the pulses having selected polarity and magnitude. For example, a positive pulse may have a magnitude and polarity of +Va (e.g., +Vr for a read pulse or +Vp for a programming pulse, where Vr is different than Vp) and a negative pulse may have a magnitude and polarity of −Va (e.g., −Vr for a read pulse or −Vp for a programming pulse, where Vr is different than Vp). Va may represent the total voltage difference across the selected memory cell during the access operation (e.g., read operation or write operation). The memory controller may control the voltages on the respective word lines 110-f and digit lines 115-f such that the voltage difference across the selected memory cell is the desired polarity and/or magnitude. In some cases, the memory controller may hold one of the access lines of the first selected memory cell 405 at zero volts and may bias the other access line to the full magnitude of Va. Such an operation will cause the selected memory cell 405 to be accessed (e.g., read or write), but it may also disturb unselected memory cells 410 coupled with the access line biased to Va. An unselected memory cell 410 may be disturbed when the voltage difference across the memory cell exceeds a programming threshold, a read threshold, or some other disturbance threshold associated with the unselected memory cell 410.

The memory controller may partition the pulse (e.g., Va) into a first voltage (e.g., +Va/2) applied to a first access line and a second voltage (e.g., −Va/2) applied to a second access line. The combination of the first voltage and the voltage will result in a full voltage difference of Va being applied to the selected memory cell 405. The memory controller may identify a magnitude, polarity, shape, or combination thereof of the first voltage and the second voltage to achieve the full voltage difference across the selected memory cell 405.

The memory controller may determine the polarity of each voltage based on the polarity of the pulse being applied to the selected memory cell 405. For example, if the pulse (e.g., read pulse or programming pulse) is a positive polarity pulse, the memory controller may apply a positive polarity voltage of +Va/2 to the digit line 115-f of the selected memory cell 405 and a negative polarity voltage of −Va/2 to the word line 110-f of the selected memory cell 405.

In some cases, the memory controller may partition the magnitude of the pulse (Va) equally between the two access lines (e.g., 50%-50% split where Va/2 is applied to both access lines). In other cases, the memory controller may partition the pulse unequally between the two access lines (e.g., 51%-49% split, 60%-40% split, 66%-33% split, 75%-25% split). The percentage splits shown here are for illustrative purposes only and are not limiting to this disclosure.

Partitioning the pulse into the first voltage and the second voltage may reduce a likelihood that a voltage difference across an unselected memory cell 410 exceeds a programming threshold, read threshold or some other disturb threshold of the unselected memory cell 410. In this manner, the memory controller may reduce a likelihood that unselected memory cells 410 in the memory tile 400 are disturbed. For example, the memory tile 400 illustrates how the voltage difference seen across each memory cell 405, 410 based on biasing some access lines to access the selected memory cells 405 (e.g., read or write).

As shown in the memory tile 400, the voltages applied to the access lines may be configured to constructively interfere with each other at the selected memory cells 405. As such, the first selected memory cell 405-a sees a positive polarity pulse during the access operation duration and the second selected memory cell 405-b sees a negative polarity pulse during the access operation. The voltages applied to the access lines are configured to cooperate together to access the first selected memory cell 405-a and the second selected memory cell 405-b concurrently.

As shown in the memory tile 400, the voltages applied to the access lines may also be configured to destructively interfere with each other at some of the unselected memory cells 410. For example, some of the unselected memory cells 410 may see a voltage difference of zero volts even though the access lines of that unselected memory cell are biased to some value for the access operation (e.g., read operation or write operation). By configuring the voltages (e.g., the first voltage and the second voltage) in such a way to constructively and/or destructively interfere with each other, the likelihood that unselected memory cells 410 that share access lines with the selected memory cells 405 are disturbed by the access operation is reduced.

The voltages applied to the access lines may also be configured such that if not constructive or destructive interference occurs in the memory tile, the voltage difference seen across the unselected memory cell 410 will not satisfy a disturb threshold (e.g., a programming threshold or a read threshold).

In some cases, if both of the selected memory cells 405 of the memory tile 400 are accessed using the same polarity of pulse, some of the unselected memory cells 410 may also be accessed inadvertently. For example, if a positive pulse is used to access both the first selected memory cell 405-a and the second selected memory cell 405-b, then unselected memory cells 410-a, 410-b may also be inadvertently accessed. In such cases, the voltages applied to the access lines may constructively interfere with one another at four memory cells instead of the selected two memory cells.

In some cases, the selected memory cells 405 configured to be accessed concurrently cannot share a common access line. Meaning that the first selected memory cell 405-a cannot be coupled with the same digit line 115-f or word line 110-f as the second selected memory cell 405-b. Such a condition may increase a likelihood that one or more unselected memory cells 410 are disturbed during the access operation.

The memory controller may be configured to identify the selected memory cells 405 for the concurrent access operation based at least in part on the location of the memory cell, the access lines of the selected memory cells 405, or whether the selected memory cells 405 share an access line. In some cases, the memory controller may be configured to determine whether the selected memory cells 405 share a common access line after the memory cells have been selected. If the memory controller determines that the selected memory cells 405 share a common access line, the memory controller may cancel the access operation for one of the selected memory cells 405. In such cases, the access operation performed during the single access operation duration may be used to access only a single memory cell.

In some cases, any combination of memory cells may be accessed concurrently. In such cases, the memory controller may be configured to dynamically select the memory cells to be accessed during the single access operation duration based on commands received from a host device. To decrease the latency for performing a read command or a write command received from a host device, the memory device may access two or more memory cells 405 concurrently in the same memory tile 400. In some cases, such concurrent accessing may reduce the total time taken by the memory device to execute the read command or the write command to a host device after receiving the command.

The principles described with reference to accessing two memory cells of the memory tile 400 concurrently using the same type of access operation (e.g., two read operations or two write operations), apply also more generally to any combination of access operations. For example, a memory controller may be configured to write to a first memory cell and read from a second memory cell on the same tile concurrently using similar principles as described in FIG. 4.

Figure 5:
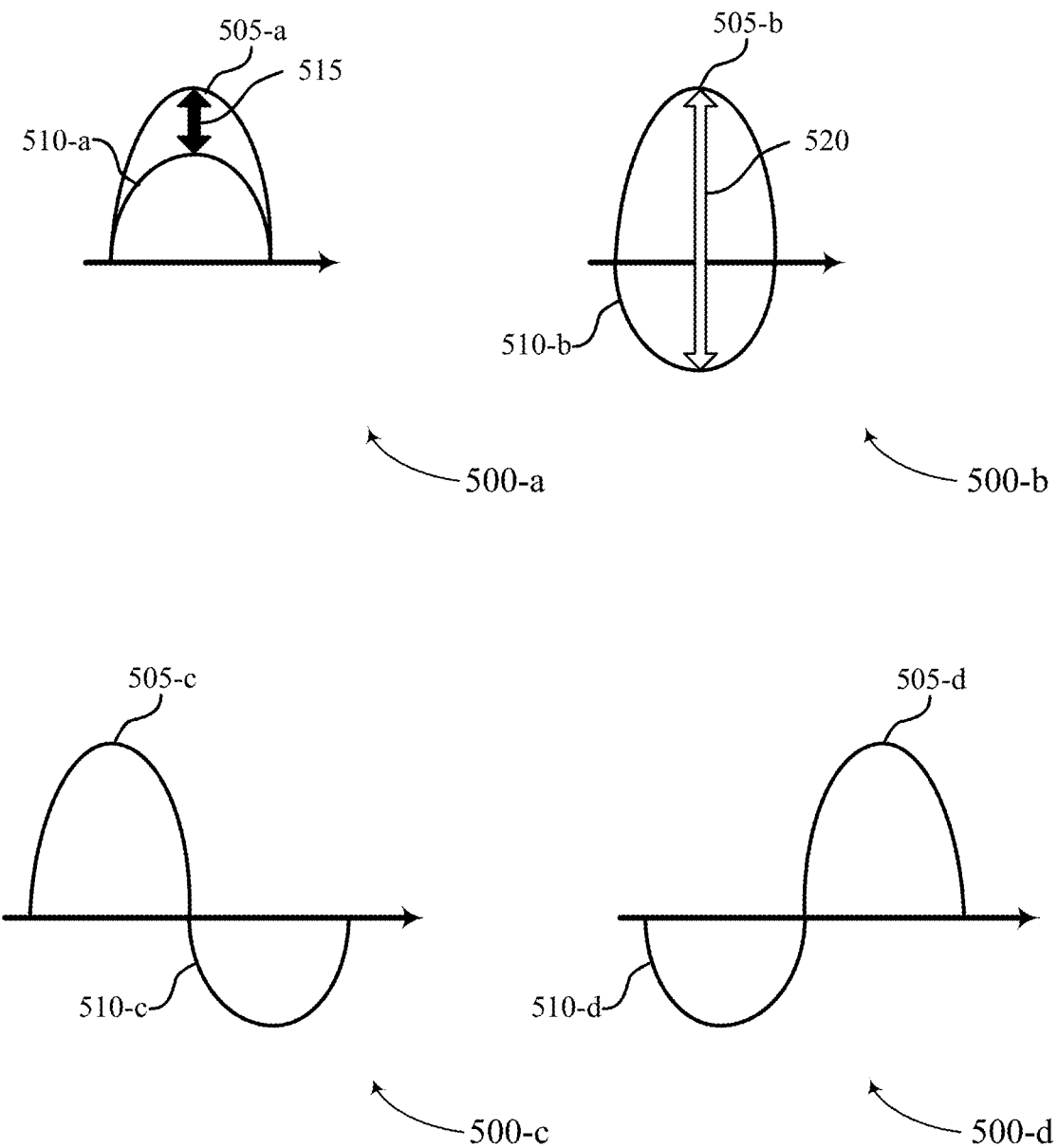
FIG. 5 illustrates examples of diagrams that support systems and techniques for accessing multiple memory cells concurrently in accordance with various examples of the present disclosure.

FIG. 5 illustrates examples of diagrams 500 of access pulses seen at an unselected memory cell in a memory tile that supports systems and techniques for accessing multiple memory cells concurrently in accordance with various examples of the present disclosure. In some circumstances, the memory controller may want to access two memory cells of a memory tile using two access pulses that will disturb unselected memory cells. To prevent disturbing unselected memory cells while still accessing two selected memory cells during a single access operation duration, the memory controller may delay one of the access pulses.

The features of the diagrams 500 may be implemented in the memory tile 400 described with reference to FIG. 4. The access pulses described with reference to the diagrams 500 may be examples of two read pulses or two programming pulses.

Diagram 500-a illustrates voltages 505-a, 510-a seen by an unselected memory cell of a memory tile (e.g., unselected memory cell 410 of the memory tile 400) during an access operation. In the diagram 500-a, the voltages 505-a, 510-a may "destructively" interfere with each other to prevent the unselected memory cell from being disturbed. For example, the first voltage 505-a may have a first polarity and first magnitude (e.g., +Va/2) and the voltage 510 may have the same polarity and, in some cases, the same magnitude (e.g., +Va/2). The combination of these two voltages 505-a, 510-a may result in a voltage difference 515 that fails to satisfy a disturb threshold of the unselected memory cell (e.g., a programming threshold or a read threshold or some other threshold). In some cases, the magnitudes and/or polarities of the two voltages 505-a, 510-a may be different, but the resulting voltage difference still may fail to satisfy the disturb threshold.

Diagram 500-b illustrates voltages 505-b, 510-b seen by an unselected memory cell of a memory tile (e.g., unselected memory cell 410 of the memory tile 400) during an access operation. In the diagram 500-b, the voltages 505-b, 510-b may "constructively" interfere with each other to cause the unselected memory cell to be disturbed during the access operation (e.g., read operation or write operation). For example, the first voltage 505-b may have a first polarity and first magnitude (e.g., +Va/2) and the voltage 510-b may have a different polarity and, in some cases, the same magnitude (e.g., −Va/2). The combination of these two voltages 505-b, 510-b may result in a voltage difference 520 that satisfies a disturb threshold of the unselected memory cell (e.g., a programming threshold or a read threshold or some other threshold). In some cases, the magnitudes and/or polarities of the two voltages 505, 510 may be different, but the resulting voltage difference still may satisfy the disturb threshold.

The memory controller may identify when two access pulses for two selected memory cells of a memory tile (e.g., read-read pulses, programming-programming pulses, or programming-read pulses) may disturb one or more unselected memory cells. The memory controller may identify this condition using a variety of means. In some cases, the memory controller may compare the voltages of the access pulses to a predefined list of forbidden voltage combinations. In some cases, the memory controller may compare the memory cell locations, the magnitude, and/or the polarities of the access pulses to a predefined list of forbidden combinations. In some cases, memory controller may dynamically determine interactions for each memory cell to identify if an unselected memory cell may be disturbed.

The memory controller may be configured to delay one of the access pulses for one of the selected memory cells of the memory tile based on the potential that an unselected memory cell may be disturbed. Diagram 500-c illustrates an example where the memory controller delays a second voltage 510-c to occur sometime after the first voltage 505-c. Diagram 500-d illustrates an example where the memory controller delays a first voltage 505-d to occur sometime after the second voltage 510-d. By staggering the access pulses in such a manner, the memory controller may be configured to prevent the voltage difference 520 seen across an unselected memory cell from satisfying a disturbance threshold.

In some cases, the delayed pulse may occur after the initial pulse is complete. In some cases, the initial pulse and the delayed pulse may at least partially overlap. The memory controller may select which pulse is delay based on the memory cell location, the polarity of the pulses, the magnitude of the pulses, the shape of the pulses or a combination thereof. For example, based on their respective magnitudes and/or shapes, a first type of overlap of the pulses may be less likely to result in a disturbance of the unselected memory cell than a second type of overlap of the pulses.

In some cases, a programming operation may be accompanied with a pre-read operation. In such cases, if two cells are concurrently programmed only part of the programming operation and the pre-read operation may be delayed. For example, the pre-read operation may occur currently, but one of the programming pulses may be delayed.

Figure 6:
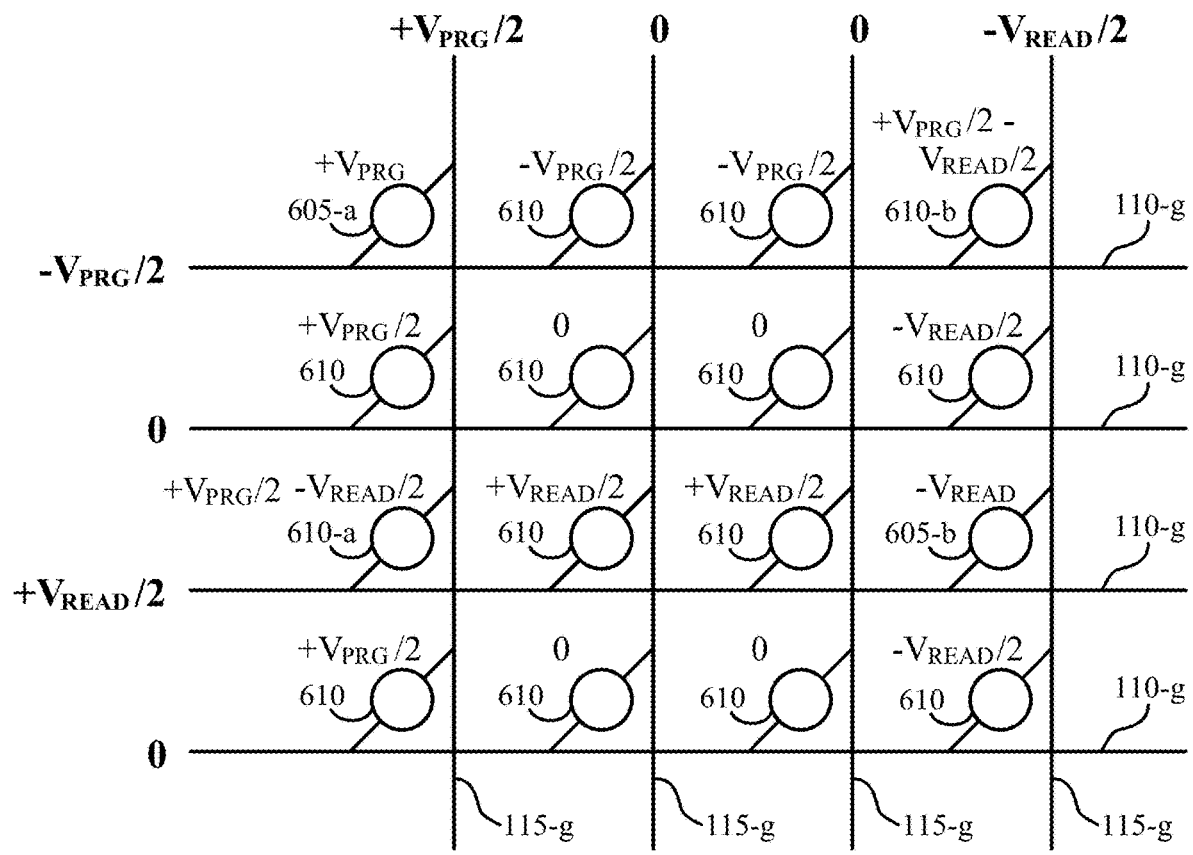
FIG. 6 illustrates an example of a memory tile that supports systems and techniques for accessing multiple memory cells concurrently in accordance with various examples of the present disclosure.

FIG. 6 illustrates an example of a memory tile 600 that supports systems and techniques for accessing multiple memory cells concurrently in accordance with various examples of the present disclosure. Specifically, FIG. 6 illustrates two memory cells on the memory tile 600 being accessed concurrently using the different types of access operations (e.g., a read operation and write operation) during the same access operation duration. For example, a first selected memory cell 605-a may be programmed during the access operation duration and a second selected memory cell 605-b may be read during the access operation duration, or vice-versa.

The memory tile 600 includes a plurality of memory cells 605, 610, a plurality of word lines 110-g, and a plurality of digit lines 115-g. The memory tile 600 illustrates how a first selected memory cell 605-a may be programmed using a programming pulse having a first polarity and a second selected memory cell 605-b may be read using a read pulse having a second polarity different from the first polarity, where the selected memory cells 605 are accessed concurrently. The memory tile 600 illustrates principles where two different types of pulses are used concurrently. The memory tile 600 may also include a plurality of unselected memory cells 610. The memory tile 600 may be an example of the memory tiles 100 and 400 described with reference to FIGS. 1 and 4. The memory cells 605, 610 may be examples of the memory cells 105, 405, 410 described with reference to FIGS. 1-4.

The memory controller (not shown) associated with the memory tile 600 may operate similarly as the memory controller for the memory tile 400. For example, the memory controller may select memory cells to be accessed (e.g., selected memory cells 605), may select characteristics (e.g., magnitude, polarity, or shape) of pulses to be applied to the selected memory cells 605, may determine voltages to apply to access lines based on the identified pulses, may perform operations to ensure that unselected memory cells 610 are not disturbed, may perform other operations and functions, or a combination thereof.

When different access operations are performed on the same memory tile during the same access duration, differences between the different types of pulses may disturb cause disturbances on unselected memory cells 610. For example, a programming pulse may have one or more characteristics that are different from one or more characteristics a read pulse. In some cases, a magnitude of the programming pulse may be greater than a magnitude of the read pulse. Further, differences in the shapes of the programming pulse and the read pulse may increase a likelihood of disturbing an unselected memory cell 610 during at least a portion of the access operation duration where both a write operation and a read operation are performed on different memory cells of the same memory tile 600.

The memory controller may be configured to select the characteristics of the pulses and partition the pulses into voltages for access lines in a manner to reduce a likelihood of disturbing an unselected memory cell 610. Diagrams 700 and 800 illustrate issues and solutions related to the interplay between programming pulses and read pulses in a memory tile.

Figure 7:
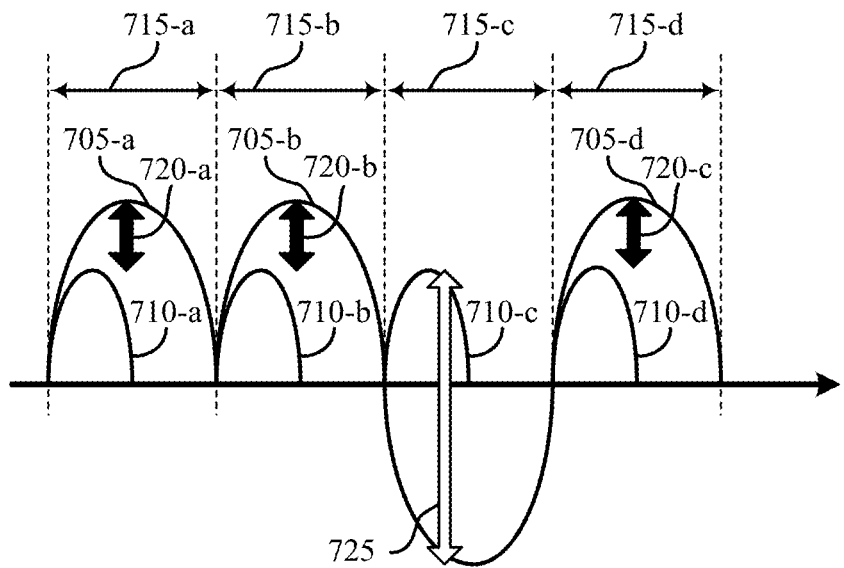
FIG. 7 illustrates an example of a diagram that supports systems and techniques for accessing multiple memory cells concurrently in accordance with various examples of the present disclosure.

FIG. 7 illustrates an example of a diagram 700 of access pulses seen at an unselected memory cell in a memory tile that supports systems and techniques for accessing multiple memory cells concurrently in accordance with various examples of the present disclosure. In some circumstances, the memory controller may want to access program a first memory cell of a memory tile concurrently with reading a second memory cell of the same memory tile. In some cases, performing both operations concurrently may disturb unselected memory cells of the memory tile. To prevent disturbing unselected memory cells while still accessing two selected memory cells during a single access operation duration, the memory controller may perform a variety of mitigation operations.

The features of the diagram 700 may be implemented in the memory tile 600 described with reference to FIG. 6. The access pulses described with reference to the diagram 700 may be examples of a read pulse and a programming pulse.

The diagram 700 illustrates a plurality of voltages 705, 710 seen by an unselected memory cell (e.g., unselected memory cell 610) applied to access lines during a plurality of access operation durations 715. The voltages 705, 710 may be portions of a programming pulse and a read pulse. For example, during a first access operation duration 715-a, a first programming voltage 705-a may be applied to a first access line (e.g., word line 110-g or digit line 115-g) coupled with the unselected memory cell of the memory tile and a first read voltage 710-a may be applied to a second access line (e.g., word line 110-g or digit line 115-g) coupled with the unselected memory cell of the memory tile. The first read voltage 710-a may be applied concurrently with the first programming voltage 705-a during the first access operation duration 715-a.

During the first access operation duration 715-a, the voltage difference 720 seen by the unselected memory cell may fail to satisfy a disturbance threshold (e.g., programming threshold, read threshold, or other threshold) of the unselected memory cell. In effect, first programming voltage 705-a and the first read voltage 710-a may "destructively" interfere with each other and prevent the unselected memory cell from being disturbed.

In a contrasting example, during a third access operation duration 715-c, the voltage difference 725 seen by the unselected memory cell may satisfy a disturbance threshold (e.g., programming threshold, read threshold, or other threshold) of the unselected memory cell. The third programming voltage 705-c may have a first polarity and first magnitude that cooperate with a second polarity (different from the first polarity) and a second magnitude of the third read voltage 710-c to produce the voltage difference 725 that satisfies the disturbance threshold. In effect, third programming voltage 705-c and the third read voltage 710-c may "constructively" interfere with each other and cause the unselected memory cell to be disturbed.

The memory controller may perform one or more mitigation operations to prevent the unselected memory cell from being disturbed in scenarios like those illustrated in the third access operation duration 715-c. In some cases, the memory controller may cancel either programming operation or the read operation during the access operation duration where an unselected memory cell may be disturbed. In some cases, the memory controller may partition the programming pulse into voltages that will reduce a likelihood of or prevent disturbances of unselected memory cells. Because the programming pulse and the read pulse may have different magnitudes and/or shapes, the memory controller may partition the magnitudes in such of the two pulses in such a way that risk of disturbances of unselected memory cell is mitigated. In some cases, the memory controller may delay one of the voltages similar to what is described with reference to FIG. 5.

In some cases, the memory controller may partition the pulses into unequal partitions (e.g., not a 50/50 split). In some cases, each pulse and/or voltage may have a particular shape. For instance, the third programming voltage 705-c may have a stepped shape or ramp shape and the third read voltage 710-c may have a stepped shape or ramped shape. In such instances, the memory controller may cause the ramps or steps to coincide such that a voltage difference seen at the unselected memory cell does not satisfy the disturbance threshold. For example, the third programming voltage 705-c may be an increasing ramp shape and the third read voltage 710-c may be a decreasing ramp shape during the third access operation duration 715-c.

In some cases, the memory controller may select the polarities of the programming pulse, the read pulse, and/or the partitioned voltages that result from those pulses to mitigate disturbances to unselected memory cells. In some cases, the memory controller may cause the polarities of the two voltages applied to an unselected memory cell to be different polarities (e.g., one negative and one positive).

Figure 8:
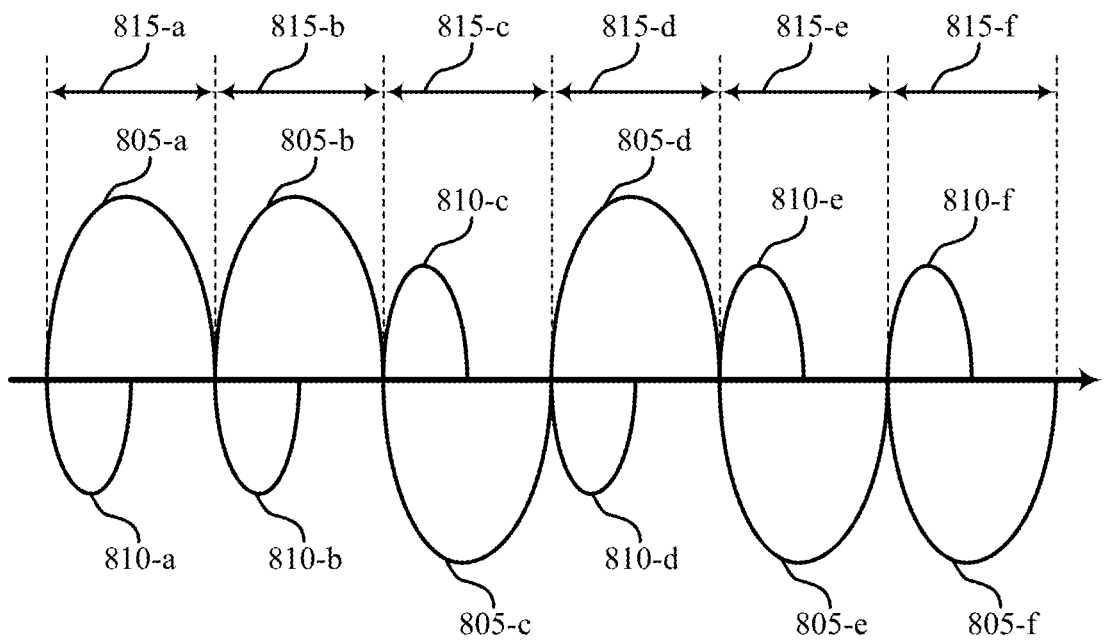
FIG. 8 illustrates an example of a diagram that supports systems and techniques for accessing multiple memory cells concurrently in accordance with various examples of the present disclosure.

FIG. 8 illustrates an example of a diagram 800 of access pulses seen at an unselected memory cell in a memory tile that supports systems and techniques for accessing multiple memory cells concurrently in accordance with various examples of the present disclosure. The diagram illustrates a process by the memory controller for mitigating disturbances on unselected memory cells when a first selected memory cell is programmed concurrently with a second selected memory cell being read on the same memory tile. The features of the diagram 800 may be implemented in the memory tile 600 described with reference to FIG. 6. The access pulses described with reference to the diagram 800 may be examples of a read pulse and a programming pulse.

Diagram illustrates an example where the memory controller selects the polarity of the read pulse (and by extension the read voltages) applied to the access lines of the memory tile based on the polarity of the programming pulse. By selecting the polarity of the read pulse based on the polarity of the programming pulse, the memory controller may mitigate the likelihood of disturbances on unselected memory cells of the memory tile. In some cases, the memory controller may select the polarity of the programming pulse based on the polarity of the read pulse.

The memory controller may identify a polarity of a programming pulse for the selected memory cell. The memory controller may make this identification based on a current state of the selected memory cell (e.g., a current ion distribution of the selected memory cell). The memory controller may then select the polarity of the read pulse to be opposite the polarity of the programming pulse to minimize of the likelihood that unselected memory cells of the memory tile will be disturbed by the simultaneous write and read of two memory cells on the memory tile.

For example, the diagram 800 illustrates a plurality of voltages 805, 810 seen by an unselected memory cell (e.g., unselected memory cell 610) applied to access lines during a plurality of access operation durations 815. The voltages 805, 810 may be portions of a programming pulse and a read pulse. During each access operation duration 815, the memory controller may identify a polarity of the programming voltage 805 applied to a first access line (e.g., word line 110-g or digit line 115-g) coupled with the unselected memory cell of the memory tile. The memory controller may also select a polarity of the read voltage 810 based on the identified polarity of the programming pulse.

For example, the memory controller may identify that during the first access operation duration 815-a the first programming voltage 805-a has a positive polarity. The memory controller may select the first read voltage 810-a to have a negative polarity based on the programming pulse having a positive polarity. In effect, the memory controller may toggle the polarity of the read pulse based on the polarity of programming pulse used to program new data on the selected memory cell. In some cases, the memory controller may be configured to toggle the polarity of the programming pulse based on the polarity of the read pulse.

Figure 9:
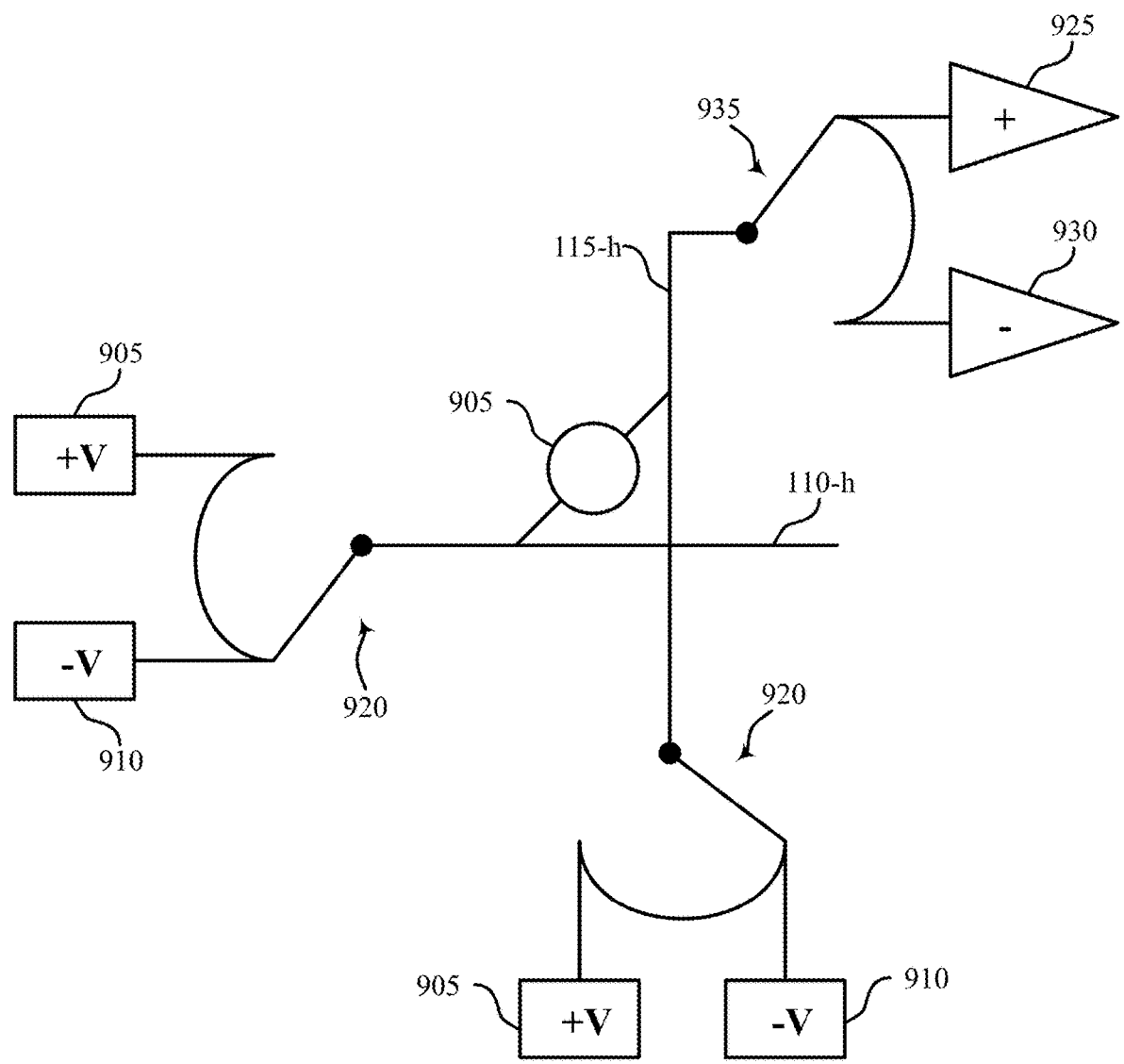
FIG. 9 illustrates an example of a circuit that supports systems and techniques for accessing multiple memory cells concurrently in accordance with various examples of the present disclosure.

FIG. 9 illustrates an example of a circuit 900 that supports systems and techniques for accessing multiple memory cells concurrently in accordance with various examples of the present disclosure. The circuit 900 illustrates the components used to dynamically modify the polarity of programming pulses and/or read pulses during an access operation.

The circuit 900 may include a memory cell 905, a word line 110-h, and a digit line 115-h. A positive polarity voltage source 910 and a negative polarity voltage source 915 may be selectively coupled to the access lines (e.g., word line 110-h or digit line 115-h). A switching component 920 may be configured to selectively couple one or more of the various voltage sources 910, 915 to the respective access line. The memory cell 905 may be an example of the memory cells 105, 405, 605 described with reference to FIGS. 1-8.

The voltage sources 910, 915 may be configured to bias their respective access lines to voltage magnitudes associated with the voltage source. In some cases, each voltage source 910, 915 is configured to output a plurality of voltage magnitudes. For example, the positive polarity voltage source 910 may be configured to output a first voltage magnitude associated with a programming pulse, a second voltage magnitude associated with a read pulse, and/or a plurality of voltage magnitudes associated with different shaped pulses. In some cases, each voltage source 910, 915 is configured to output a single voltage magnitude with a single polarity. In such cases, the access lines (e.g., word line 110-h and digit line 115-h) may be selectively coupled with more than two voltage sources 910, 915 using the switching component 920.

For example, the word line 110-h may be configured to be coupled to a positive polarity voltage source for the programming pulse, a positive polarity voltage source for a read pulse, a negative polarity voltage source for the programming pulse, a negative polarity voltage source for a read pulse, or a combination thereof. In some cases, a single voltage source may be configured to generate all of the pulses (e.g., magnitudes, polarities, and shapes) used to access the memory cell 905. In such cases, the circuit 900 may not include the switching component 920. The memory controller may also be configured to isolate/decouple the voltage sources 910, 915 from the access lines during an access operation.

The switching components 920 may be one or more transistors positioned between the voltage sources 910, 915 and their respective access lines. The memory controller may be configured to select the various voltage sources 910, 915 by controlling the gate voltages of the transistors. In some cases, the switching components 920 may include a p-type transistor for one voltage source and an n-type transistor for another voltage source. In such cases, the gates of the transistors may be tied so that only one voltage source may be coupled to an access line at a time. In some cases, both transistors may be the same type, the gates may be tied together, but one of the gates may also include an inverter. In some cases, the switching components 920 may be configured to toggle between different components. For example, the switching component 920 may couple an access with either the positive polarity voltage source 910 or the negative polarity voltage source 915.

The circuit 900 may also include a first sense component 925 and a second sense component 930 selectively coupled with the digit line 115-h using a switching component 935 (sometimes sense components are referred to as sense amplifiers). The first sense component 925 may be configured to sense a state of the memory cell 905 when a positive polarity read pulse is used during the access operation. The second sense component 930 may be configured to sense a state of the memory cell 905 when a negative polarity read pulse is used during the access operation.

The memory controller may be configured to selectively couple the digit line 115-h to one of the sense components 925, 930 based on the polarity of the read pulse being applied to the memory cell 905. The memory controller may also be configured to isolate/decouple the digit line from one of the sense components 925, 930 during an access operation. In some cases, a single sense component may be configured to sense using both positive polarity and negative polarity read pulses. In such cases, the circuit 900 may not include the switching component 935. The sense components may be examples of the sense component 125 described with reference to FIG. 1.

The switching component 935 may be one or more transistors positioned between the sense components 925, 930 and their digit access lines 115-$h$. The memory controller may be configured to select the various sense components 925, 930 by controlling the gate voltages of the transistors.

In some cases, the switching components 935 may include a p-type transistor for on sense component and an n-type transistor for another sense component. In such cases, the gates of the transistors may be tied so that only one sense component may be coupled to an access line at a time. In some cases, both transistors may be the same type, the gates may be tied together, but one of the gates may also include an inverter. In some cases, the switching components 935 may be configured to toggle between different components. For example, the switching component 935 may couple an access with either of the sense components 925, 930.

In one embodiment, a memory device may include a memory cell 905, a digit line 115-$h$ coupled with the memory cell 905, a first sense component 925 coupled with the digit line 115-$h$, the first sense component 925 may be configured to identify a logic state stored on the memory cell based at least in part on a first read pulse having a first polarity, and a second sense component 930 coupled with the digit line 115-$h$, the second sense component 930 configured to identify the logic state stored on the memory cell based at least in part on a second read pulse having a second polarity different than the first polarity.

In some examples of the memory device described above, a first voltage source 910 coupled with the digit line 115-$h$, the first voltage source 910 configured to supply at least a part of the first read pulse having the first polarity. In some examples of the device or system described above, a second voltage source 915 coupled with the digit line 115-$h$, the second voltage source 915 configured to supply at least a part of the second read pulse having the second polarity.

In some examples of the memory device described above, a switching component 920 configured to selectively couple the digit line 115-$h$ with the first voltage source 910 or the second voltage source 915 during an access operation.

In some examples of the memory device described above, a switching component 935 configured to selectively output a signal from the first sense component 925 or the second sense component 930 based at least in part on a type of read pulse applied to the memory cell 905 during a read operation.

In some examples of the memory device described above, the memory cell 905 comprises a chalcogenide material configured to use a non-uniform distribution of ions to indicate the logic state. In some examples of the memory device described above, the memory cell 905 may be a self-selecting memory cell.

Figure 10:
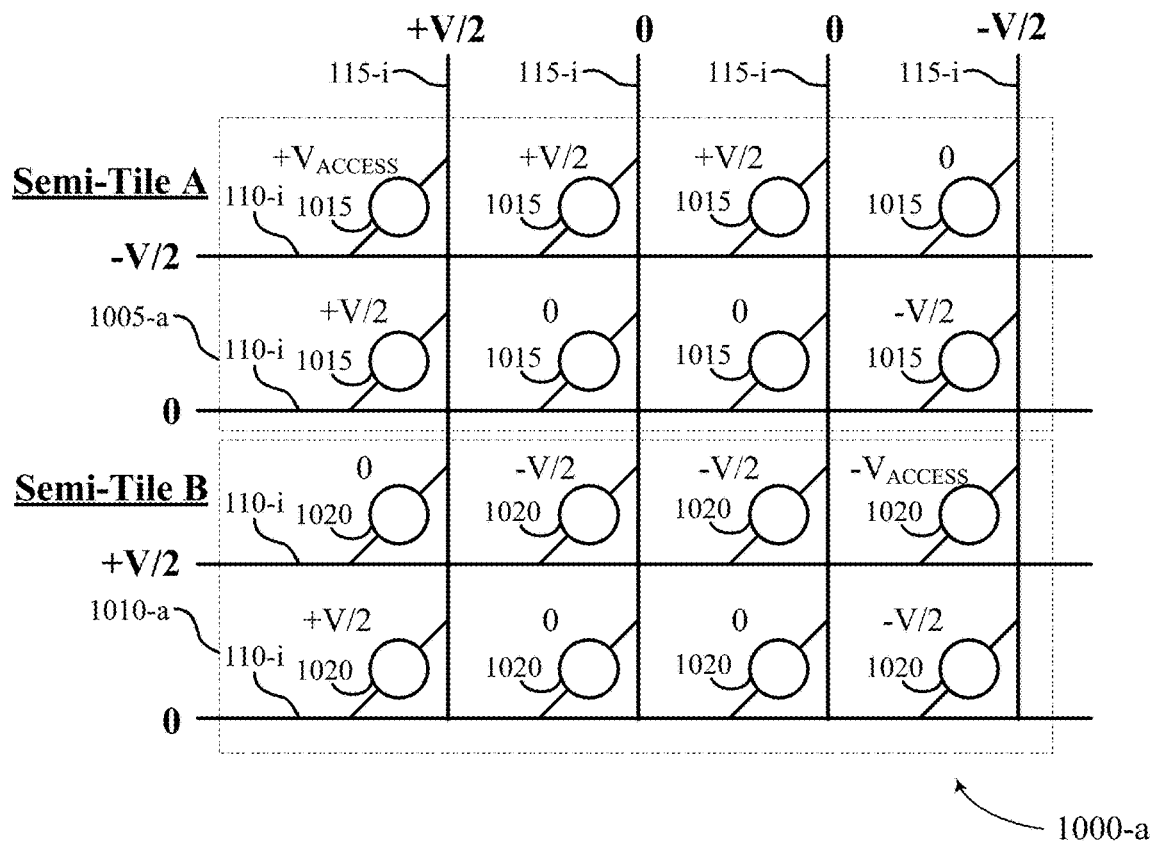
FIG. 10 illustrates examples of memory tiles that support systems and techniques for accessing multiple memory cells concurrently in accordance with various examples of the present disclosure.
Figure 10:
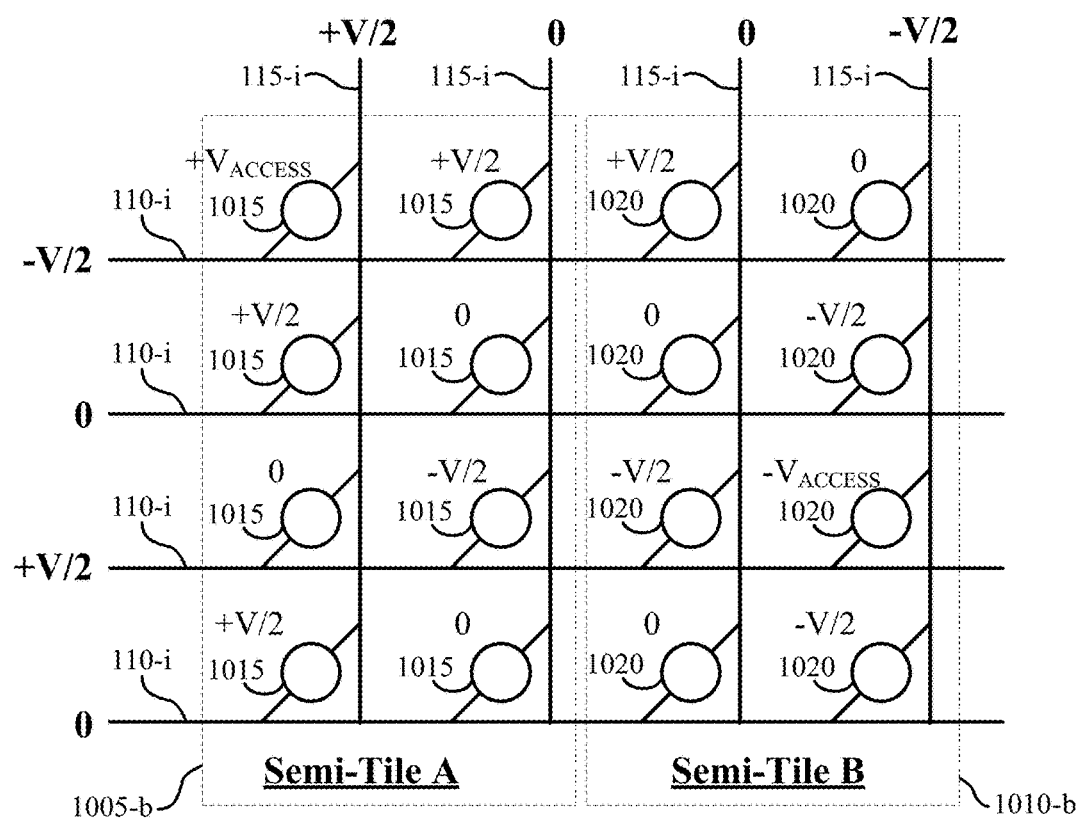

FIG. 10 illustrates examples of memory tiles 1000 that support systems and techniques for accessing multiple memory cells concurrently in accordance with various examples of the present disclosure. The memory tile 1000 may include semi-tiles 1005, 1010 that are statically or semi-statically configured. The semi-tiles 1005, 1010 may be used to implement the techniques of simultaneously accessing two memory cells of the memory tile 1000. The memory tile 1000 may be an example of the memory tiles 100, 400, 600 described with reference to FIGS. 1, 4, and 6.

Memory tiles that include a plurality of self-selecting memory cells may be configured to access nearly any pairing of memory cells concurrently. Dynamically accessing various of combinations of memory cells using various combinations of pulses may, however, increase a processing load of the memory controller. To reduce the processing needed to perform a concurrently access operations on two memory cells in the same memory tile, the memory tile 1000 may include a first semi-tile 1005 and a second semi-tile 1010.

The first semi-tile 1005 may include a plurality of memory cells 1015 configured to be read using a positive polarity read pulse. The second semi-tile 1010 may include a plurality of memory cells 1020 configured to read using a negative polarity read pulse. The memory tile may include a plurality of word lines 110-$i$ and a plurality of digit lines 115-$i$. Such a configuration may reduce the processing needed to perform a read operation because the same read pulse is used every time for a given semi-tile. In addition, such a configuration may reduce the amount of components needed to operate the memory tile 1000 (e.g., may reduce the number of sense components, switching components, voltage sources, or combinations thereof).

The memory tile 1000 may be divided into different semi-tiles in any manner. In some cases, a memory tile 1000-$a$ may include semi-tiles grouped by word lines 110-$i$. Where the first semi-tile 1005-$a$ includes memory cells 1015-$a$ in electronic communication with a first set of word lines 110-$i$ and the second semi-tile 1010-$a$ includes memory cells 1020-$a$ in electronic communication with a second set of word lines 110-$i$ different than the first set. In some cases, a memory tile 1000-$b$ may include semi-tiles grouped by digit lines 115-$i$. Where the first semi-tile 1005-$b$ includes memory cells 1015-$b$ in electronic communication with a first set of digit lines 115-$i$ and the second semi-tile 1010-$b$ includes memory cells 1020-$b$ in electronic communication with a second set of digit lines 115-$i$ different than the first set.

Even though memory cells 1015, 1020 of the memory tile 1000 are configured to be read by a specific polarity of read pulse, every memory cell 1015, 1020 of the memory cell may be configured to be programmed by a positive polarity programming pulse and a negative polarity programming pulses. Such a capability may be needed to change the distribution of ions in any given memory cell.

Access operation durations that include a read operation of a first memory cell and a read operation of a second memory cell may be performed as described with reference to FIGS. 4 and 5. The memory controller may select a memory cell 1015 in the first semi-tile 1005 and a memory cell 1020 in the second semi-tile 1010 to be read during a single access operation duration. In semi-tile configuration, it may not be possible to read two memory cells that are coupled to the same access line because of how the semi-tiles are configured.

For example, in the memory tile 1000-$a$, the word line 110-$i$ for the first semi-tile 1005-$a$ may be configured to have a negative polarity voltage during a read operation and the word line 110-$i$ for the second semi-tile 101-$a$ may be configured to have a negative polarity voltage during the read operation. To read a memory cell, that means the corresponding digit line 115-$i$ for each semi-tile 1005-$a$, 1010-$a$ may be biased to a voltage having an opposite polarity as its associated word line 110-$i$. Because a single digit line 115-$i$ cannot be biased to both a positive polarity voltage and a negative polarity voltage at the same time, if two memory cells in the semi-tile configurations are to be read during the same access operation duration they cannot share a common digit line 115-*i* or a common word line 110-*i*. In some cases, any two memory cells of the memory tile 1000 may be read concurrently as long as the two memory cells do not share a common access line (either a common word line or a common digit line).

In the semi-tile configurations of the memory tile 1000, the polarity of the read pulses are statically configured for each semi-tile. For example, memory cells 1015 of the first semi-tile 1005 may be read using a positive polarity read pulse and memory cells 1020 of the second semi-tile 1010 may be read using a negative polarity read pulse, or vice-versa. Because of this static configuration of read pulses, the memory controller may be configured to select the polarity of programming pulse based on which semi-tile the memory cell is in, the desired logic state of the memory cell, the current state of the memory cell, or the polarity of the read pulse that will be used to read the memory cell, or a combination thereof.

For example, in the first semi-tile 1005 where memory cells 1015 are read using a positive polarity read pulse, if a positive polarity programming pulse is applied to the memory cell 1015, a first distribution of ions may occur on the memory cell 1015, which the positive polarity read pulse may interpret as a logic '1'. Similarly, if a negative polarity programming pulse is applied to the memory cell 1015, a second distribution of ions different than the first distribution may occur on the memory cell 1015, which the positive polarity read pulse may interpret as a logic '0'.

Conversely, in the second semi-tile 1010 where memory cells 1020 are read using a negative polarity read pulse, if a positive polarity programming pulse is applied to the memory cell 1020, the first distribution of ions may occur on the memory cell 1020, which the negative polarity read pulse may interpret as a logic '0'. Similarly, if a negative polarity programming pulse is applied to the memory cell 1020, the second distribution of ions may occur on the memory cell 1020, which the negative polarity read pulse may interpret as a logic '1'. In such cases, a logic '1' is written to the memory cells of the different semi-tiles using different polarity programming pulses. For example, a logic '1' is stored on the first semi-tile 1005 using a positive polarity programming pulse and a logic '1' is stored on the second semi-tile 1010 using a negative polarity programming pulse. In some cases, the memory controller may be configured to invert the sensed logic state before it is output. In such cases, a logic '1' may be stored to both semi-tiles using the same polarity of programming pulse.

In some cases, the memory controller may not apply a programming pulse during a write operation. For example, if a memory cell already stores a logic '1' stored thereon and the write command indicates that the next desired logic state is a logic '1,' the memory controller may take no action during the write operation and indicate that the desired value is written to the memory cell.

In the semi-tile configurations of the memory tile 1000, various combinations of programming pulses, read pulses, bit transitions, or combinations thereof may disturb unselected memory cells of the memory tile 1000. This may occur because the static configuration of read pulses reduces some of the flexibility of the access operations. The memory controller may be configured to identify "forbidden" combinations of access operations that may occur concurrently in a memory tile 1000 with semi-tiles 1005, 1010. Forbidden combinations of access operations may occur when an unselected memory cell of the memory tile 1000 sees a voltage difference that satisfies a disturb threshold (e.g., a programming threshold or a read threshold).

Table 1 illustrates voltage differences that may occur across an unselected memory cell of the memory tile 1000 when two memory cells in the memory tile 1000 are programmed concurrently (e.g., a first memory cell 1015 in the first semi-tile 1005 is programmed concurrently with programming a second memory cell 1020 in the second semi-tile 1010). Table 1 indicates which programming bit transitions may result in an unselected memory cell of the memory tile 1000 seeing a voltage difference that satisfies a disturb threshold.

TABLE 1

Simultaneous Write Operations in Different Semi-Tiles

| | Semi-tile 1005 | | | |
|---|---|---|---|---|
| Semi-tile 1010 | Bit Transition: 0→0 ($V_{PRG-1005} = 0$) | Bit Transition: 0→1 ($V_{PRG-1005} > 0$) | Bit Transition: 1→0 ($V_{PRG-1005} < 0$) | Bit Transition: 1→1 ($V_{PRG-1005} = 0$) |
| Bit Transition: 0→0 ($V_{PRG-1010} = 0$) | $\Delta V = 0$ | $\Delta V = V_{PRG}/2$ | $\Delta V = V_{PRG}/2$ | $\Delta V = 0$ |
| Bit Transition: 0→1 ($V_{PRG-1010} < 0$) | $\Delta V = V_{PRG}/2$ | $\Delta V = V_{PRG}$ Disturb | $\Delta V = 0$ | $\Delta V = V_{PRG}/2$ |
| Bit Transition: 1→0 ($V_{PRG-1010} > 0$) | $\Delta V = V_{PRG}/2$ | $\Delta V = 0$ | $\Delta V = V_{PRG}$ Disturb | $\Delta V = V_{PRG}/2$ |
| Bit Transition: 1→1 ($V_{PRG-1010} = 0$) | $\Delta V = 0$ | $\Delta V = V_{PRG}/2$ | $\Delta V = V_{PRG}/2$ | $\Delta V = 0$ |

In the semi-tile configurations, the memory controller may be configured to determine whether an unselected memory cell in the memory tile may be disturbed on a semi-tile level. Such a configuration may reduce processing for performing the concurrent write operations and thereby reduce power consumption, reduce processing time (e.g., latency), or a combination thereof. In some examples, the memory controller may identify the bit transition for each semi-tile during the concurrent access operation and may determine whether an unselected memory cell in the memory tile will be disturbed based on the bit transitions. In such examples, the memory controller may not have to check if the combination of write operations is permissible on a memory cell by memory cell basis, but rather may check on a semi-tile by semi-tile basis. In some cases, the memory controller may compare the bit transitions using a look-up table stored in memory.

Upon determining that one or more unselected memory cells may be disturbed by performing the two write operations concurrently in the same memory tile with semi-tiles, the memory controller may perform one or more disturbance mitigation operations. For example, the memory controller may cancel one of the write operations and perform it during a later access operation duration other than the current duration. In some examples, the memory controller may delay one of the programming pulses within the same access operation duration. In some cases, the memory controller may modify the shape of one or more voltages applied to the memory cells during the two concurrent write operations.

Table 2 illustrates voltage differences that may occur across an unselected memory cell of the memory tile 1000 when a first memory cell of the memory tile 1000 is programmed concurrently with reading a second memory cell of the memory tile 1000 (e.g., a first memory cell 1015 in the first semi-tile 1005 is programmed concurrently with reading a second memory cell 1020 in the second semi-tile 1010). Table 2 indicates which programming pulse polarities in combination with a read pulse polarities may result in an unselected memory cell of the memory tile 1000 seeing a voltage difference that satisfies a disturb threshold.

In some cases, the memory controller may compare the pulse polarities and/or the pulse polarities using a look-up table stored in memory.

Upon determining that one or more unselected memory cells may be disturbed by performing the two write operations concurrently in the same memory tile with semi-tiles, the memory controller may perform one or more disturbance mitigation operations. For example, the memory controller may cancel one of the access operations (either the read operation or the write operation) and perform it during a later access operation duration other than the current duration. In some examples, the memory controller may delay one of the pulses (either the read pulse or the programming pulse) within the same access operation duration. In some cases, the memory controller may modify the shape of one or more voltages applied to the memory cells during the two concurrent access operations.

In one embodiment, a memory device may include a memory tile 1000 having a first section of memory cells (e.g., first semi-tile 1005) and a second section of memory cells (e.g., second semi-tile 1010), wherein the memory cells 1015 of the first section are configured to be read in response to application of a first read pulse having a first polarity and the memory cells 1020 of the second section are configured to be read in response to application of a second read pulse having a second polarity different than the first polarity, a first sense component (e.g., sense component 1120 or 1155) coupled with the first section of memory cells of the memory

TABLE 2

| | Simultaneous Read-Write Operations in Different Semi-Tiles | | | |
|---|---|---|---|---|
| | Write | | | |
| Read | Semi-tile 1005 ($V_{PRG\text{-}1005} > 0$) | Semi-tile 1005 ($V_{PRG\text{-}1005} < 0$) | Semi-tile 1010 ($V_{PRG\text{-}1010} < 0$) | Semi-tile 1010 ($V_{PRG\text{-}1010} > 0$) |
| Semi-tile 1005 ($V_{READ} > 0$) | — | — | $\Delta V = (V_{PRG} + V_{READ})/2$ Disturb | $\Delta V = (V_{PRG} - V_{READ})/2$ |
| Semi-tile 1010 ($V_{READ} < 0$) | $\Delta V = (V_{PRG} + V_{READ})/2$ Disturb | $\Delta V = (V_{PRG} - V_{READ})/2$ | — | — |

In Table 2, only a positive polarity read pulse is shown for the semi-tile 1005 and only a negative polarity read pulse is shown for the semi-tile 1010 because by definition only a single polarity of read pulse is associated with teach semi-tile. In some cases, the polarities of read pulses assigned to each semi-tile may be reversed.

In the semi-tile configurations, the memory controller may be configured to determine whether an unselected memory cell in the memory tile may be disturbed on a semi-tile level by concurrently performing a read operation and a write operation on the same memory tile 1000. Such a semi-tile configuration may reduce processing for performing the concurrent write operation and read operation and thereby reduce power consumption, reduce processing time (e.g., latency), or a combination thereof. In some examples, the memory controller may identify the pulse polarities and/or the bit transition for each semi-tile during the concurrent access operations and may determine whether an unselected memory cell in the memory tile will be disturbed based on the pulse polarities and/or the bit transitions.

In such examples, the memory controller may not have to check if the combination of the write operation and the read operation is permissible on a memory cell by memory cell basis, but rather may check on a semi-tile by semi-tile basis.

tile 1000 and configured to identify a logic state of one memory cell of the first section of memory cells based at least in part on the first read pulse having the first polarity, and a second sense component (e.g., sense component 1120 or 1155) coupled with the second section of memory cells of the memory tile and configured to identify the logic state of one memory cell of the second section of memory cells based at least in part on the second read pulse having the second polarity.

In some examples of the memory device described above, a first voltage source (e.g., voltage sources 910, 915) coupled with digit lines 115 of the first portion, the first voltage source (e.g., voltage sources 910, 915) configured to supply at least a portion of the first read pulse having the first polarity. In some examples of the device or system described above, a second voltage source (e.g., voltage sources 910, 915) coupled with digit lines of the second portion, the second voltage source (e.g., voltage sources 910, 915) configured to supply at least a portion of the second read pulse having the second polarity.

In some examples of the memory device described above, a memory cell 1015, 1020 of the memory tile 1000 may be formed of a chalcogenide material configured to use a non-uniform distribution of ions to indicate the logic state. In some examples of the memory device described above one or more trim parameters for the first portion of memory cells may be independent from one or more trim parameters for the second portion of memory cells.

In some examples of the memory device described above, the first sense component (e.g., sense component 1120) and the second sense component (e.g., sense component 1120) may be position under a footprint (e.g., footprint 1170) of the memory tile 1000. In some examples of the memory device described above, the memory tile 1000 includes more than one deck of memory cells.

Figure 11:
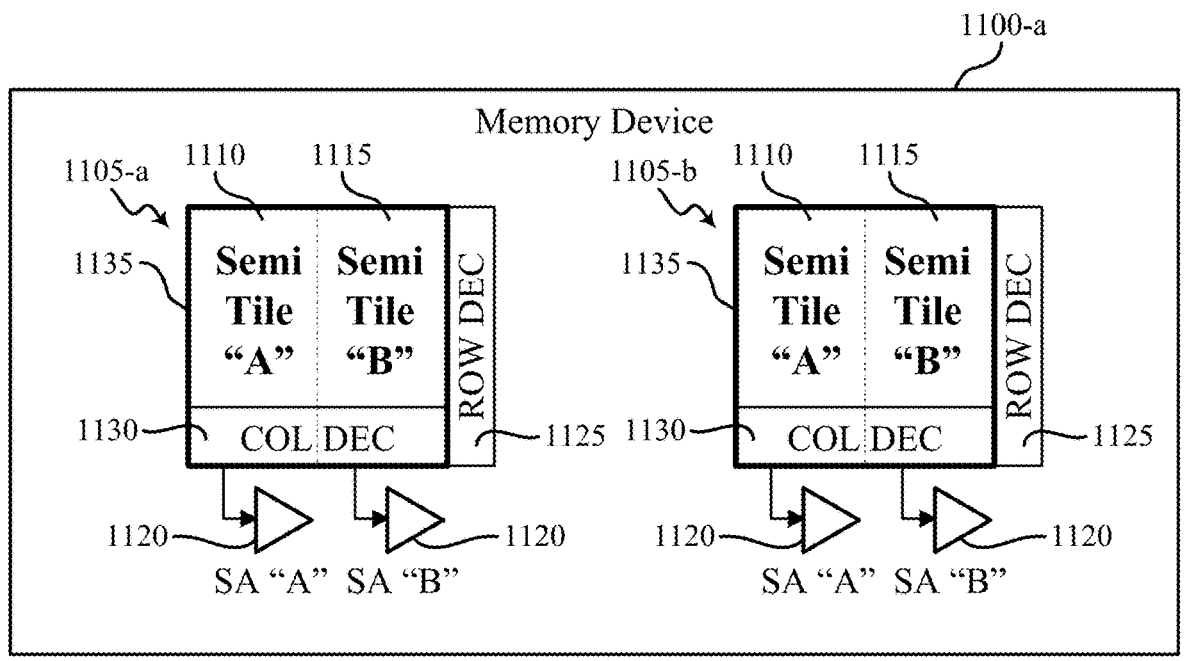
FIG. 11 illustrates examples of memory devices that support systems and techniques for accessing multiple memory cells concurrently in accordance with various examples of the present disclosure.
Figure 11:
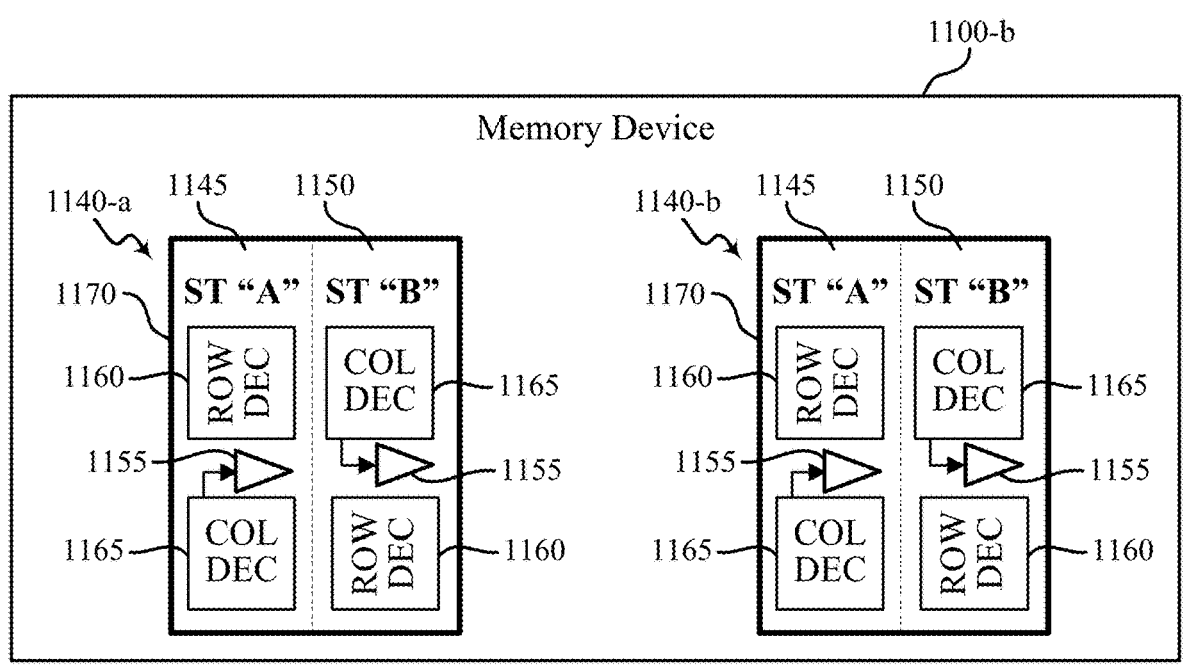

FIG. 11 illustrates examples of memory devices 1100 that supports systems and techniques for accessing multiple memory cells concurrently in accordance with various examples of the present disclosure. The memory devices 1100 may include a plurality of memory tiles. Each memory tile of the memory devices may be divided into two or more semi-tiles. The memory devices 1100 illustrate components configured to perform access operations on at least two memory cells of a memory tile concurrently.

A first memory device 1100-a may include a plurality of memory tiles 1105, each memory tile 1105 being divided into a first semi-tile 1110 configured to be read by a positive polarity read pulse and a second memory tile 1115 configured to be read by a negative polarity read pulse. The memory tile 1105 may include a sense component 1120 coupled with each semi-tile 1110, 1115. The sense components 1120 may be configured to identify a logic state of the memory cell based on the polarity of the read pulse associated with that semi-tile.

In the memory tile 1105, the sense components 1120 may be positioned outside of the footprint 1135 of an array of memory cells. The memory tile 1105 may include a row decoder 1125 and column decoder 1130 configured to address the memory cells of both of the semi-tiles 1110, 1115. In the memory tile 1105, at least one of the row decoder 1125 or the column decoder 1130 or both may be positioned outside of the footprint 1135 of an array of memory cells. In some cases, at least one of the row decoder 1125 or the column decoder 1130 or both may be positioned within under the array of memory cells and/or within a footprint 1135 of the array of memory cells.

A second memory device 1100-b may include a plurality of memory tiles 1140, each memory tile 1140 being divided into a first semi-tile 1145 configured to be read by a positive polarity read pulse and a second memory tile 1150 configured to be read by a negative polarity read pulse. The memory tile 1140 may include a sense component 1155 coupled with each semi-tile 1145, 1150. The sense components 1155 may be configured to identify a logic state of the memory cell based on the polarity of the read pulse associated with that semi-tile. In the memory tile 1140, the sense components 1155 may be positioned in the footprint 1170 of an array of memory cells.

In such configurations, the sense components 1155 may be positioned in a CMOS under the array. The memory tile 1140 may include a row decoder 1160 and column decoder 1165 configured to address the memory cells of both of the semi-tiles 1145, 1150. In the memory tile 1140, at least one of the row decoder 1160 or the column decoder 130 or both may be positioned within under the array of memory cells and/or within a footprint 1170 of the array of memory cells. In such configurations, the at least one of the row decoder 1160 or the column decoder 130 or both may be positioned in a CMOS under the array. In some cases, at least one of the row decoder 1160 or the column decoder 1165 or both may be positioned outside of the footprint 1170 of an array of memory cells.

The memory tiles 1105, 1140 of the memory devices 1100 may include components not shown. In some cases, the memory tiles 1105, 1140 may include one or more voltage sources and/or one or more switching components configured to selectively couple the one or more voltage sources to their respective access lines. For example, the memory tiles 1105, 1140 may include some or all of the components described with reference to FIG. 9. In some cases where sense components are associated with entire semi-tiles, the memory tiles 1105, 1140 may not include switching components configured to selective couple different sense components to a digit line.

Figure 12:
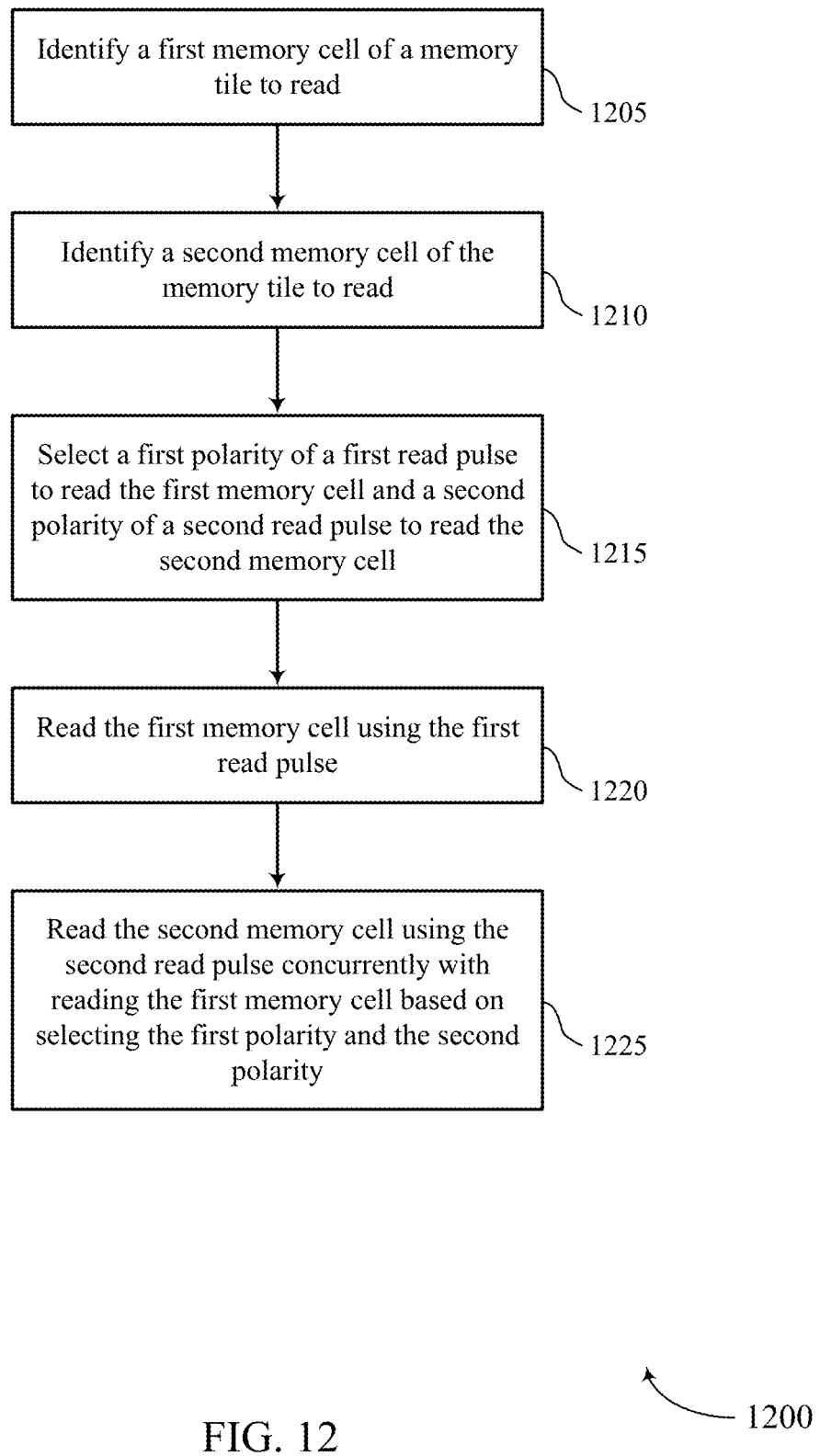
FIGS. 12 through 17 illustrate methods for systems and techniques for accessing multiple memory cells concurrently in accordance with embodiments of the present disclosure.

FIG. 12 shows a flowchart illustrating a method 1200 for system and techniques for accessing multiple memory cells concurrently in accordance with embodiments of the present disclosure. The operations of method 1200 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1205, the memory controller 140 may identify a first memory cell of a memory tile to read. The operations of 1205 may be performed according to the methods described herein.

At block 1210, the memory controller 140 may identify a second memory cell of the memory tile to read. The operations of 1210 may be performed according to the methods described herein.

At block 1215, the memory controller 140 may select a first polarity of a first read pulse to read the first memory cell and a second polarity of a second read pulse to read the second memory cell. The operations of 1215 may be performed according to the methods described herein.

At block 1220, the memory controller 140 may read the first memory cell using the first read pulse. The operations of 1220 may be performed according to the methods described herein.

At block 1225, the memory controller 140 may read the second memory cell using the second read pulse concurrently with reading the first memory cell based at least in part on selecting the first polarity and the second polarity. The operations of 1225 may be performed according to the methods described herein.

An apparatus for performing the method 1200 is described. The apparatus may include means for identifying a first memory cell of a memory tile to read, means for identifying a second memory cell of the memory tile to read, means for selecting a first polarity of a first read pulse to read the first memory cell and a second polarity of a second read pulse to read the second memory cell, means for reading the first memory cell using the first read pulse, and means for reading the second memory cell using the second read pulse concurrently with reading the first memory cell based at least in part on selecting the first polarity and the second polarity.

In some examples of the method 1200 and apparatus described above, the first polarity of the first read pulse may be opposite the second polarity of the second read pulse. Some examples of the method 1200 and apparatus described above may further include processes, features, means, or instructions for applying voltages to access lines coupled with the first memory cell and the second memory cell concurrently based at least in part on selecting the first polarity and the second polarity, wherein reading the second memory cell concurrently with the first memory cell may be based at least in part on applying the voltages to the access lines.

Some examples of the method 1200 and apparatus described above may further include processes, features, means, or instructions for partitioning the first read pulse into a first voltage to apply to a first access line and a second voltage to apply to a second access line, the first access line and the second access line coupled with the first memory cell. Some examples of the method 1200 and apparatus described above may further include processes, features, means, or instructions for identifying a magnitude and a polarity of the first voltage based at least in part on the first polarity of the first read pulse. Some examples of the method 1200 and apparatus described above may further include processes, features, means, or instructions for identifying, based at least in part on the first polarity of the first read pulse and the first voltage, a magnitude of the second voltage different than the magnitude of the first voltage and a polarity of the second voltage different than the polarity of the first voltage, wherein applying the voltages may be based at least in part on the partitioning and the identifying.

Some examples of the method 1200 and apparatus described above may further include processes, features, means, or instructions for identifying a first logic state stored on the first memory cell and a second logic state stored on the second memory cell based at least in part reading the second memory cell concurrently with reading the first memory cell.

Some examples of the method 1200 and apparatus described above may further include processes, features, means, or instructions for coupling the first memory cell to a first type of sense component based at least in part on the first read pulse having the first polarity. Some examples of the method 1200 and apparatus described above may further include processes, features, means, or instructions for coupling the second memory cell to a second type of sense component different than the first type based at least in part on the second pulse having the second polarity.

In some examples of the method 1200 and apparatus described above, the first polarity and the second polarity may be selected such that a voltage difference caused by the first read pulse or the second read pulse at a third memory cell of the memory tile does not satisfy a programming threshold of the third memory cell.

Some examples of the method 1200 and apparatus described above may further include processes, features, means, or instructions for determining that the first memory cell and the second memory cell may be coupled with a common access line, wherein the first polarity and the second polarity may be the same based at least in part on determining that the first memory cell and the second memory cell may be coupled with the common access line.

Figure 13:
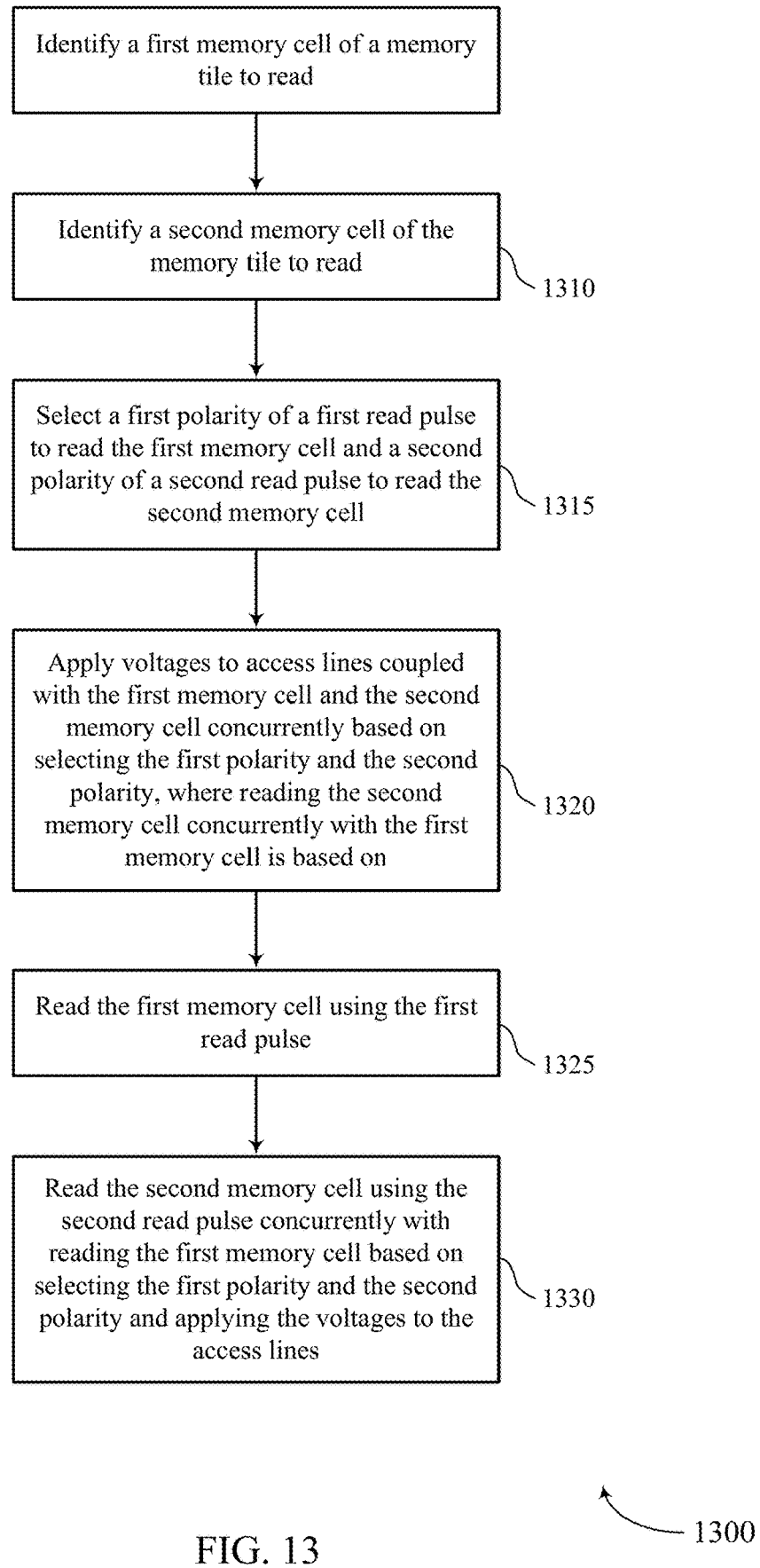

FIG. 13 shows a flowchart illustrating a method 1300 for system and techniques for accessing multiple memory cells concurrently in accordance with embodiments of the present disclosure. The operations of method 1300 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1305, the memory controller 140 may identify a first memory cell of a memory tile to read. The operations of 1305 may be performed according to the methods described herein.

At block 1310, the memory controller 140 may identify a second memory cell of the memory tile to read. The operations of 1310 may be performed according to the methods described herein.

At block 1315, the memory controller 140 may select a first polarity of a first read pulse to read the first memory cell and a second polarity of a second read pulse to read the second memory cell. The operations of 1315 may be performed according to the methods described herein.

At block 1320, the memory controller 140 may apply voltages to access lines coupled with the first memory cell and the second memory cell concurrently based at least in part on selecting the first polarity and the second polarity. The operations of 1320 may be performed according to the methods described herein.

At block 1325, the memory controller 140 may read the first memory cell using the first read pulse. The operations of 1325 may be performed according to the methods described herein.

At 1330 the memory controller 140 may read the second memory cell using the second read pulse concurrently with reading the first memory cell based at least in part on selecting the first polarity and the second polarity and applying the voltages the access lines. The operations of 1330 may be performed according to the methods described herein.

Figure 14:
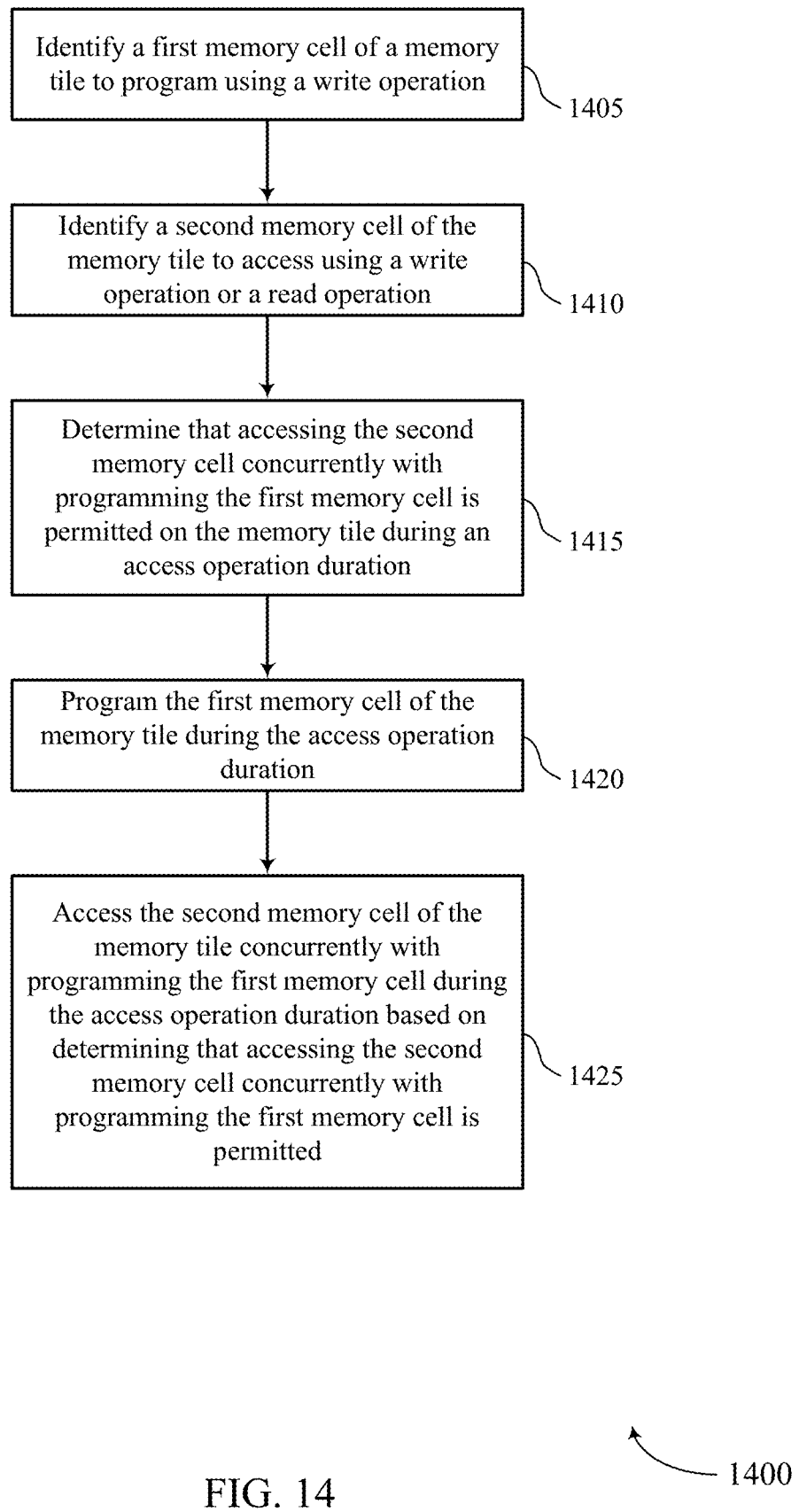

FIG. 14 shows a flowchart illustrating a method 1400 for system and techniques for accessing multiple memory cells concurrently in accordance with embodiments of the present disclosure. The operations of method 1400 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1405, the memory controller 140 may identify a first memory cell of a memory tile to program using a write operation. The operations of 1405 may be performed according to the methods described herein.

At block 1410, the memory controller 140 may identify a second memory cell of the memory tile to access using a write operation or a read operation. The operations of 1410 may be performed according to the methods described herein.

At block 1415, the memory controller 140 may determine that accessing the second memory cell concurrently with programming the first memory cell is permitted on the memory tile during an access operation duration. The operations of 1415 may be performed according to the methods described herein.

At block 1420, the memory controller 140 may program the first memory cell of the memory tile during the access operation duration. The operations of 1420 may be performed according to the methods described herein.

At block 1425, the memory controller 140 may access the second memory cell of the memory tile concurrently with programming the first memory cell during the access operation duration based at least in part on determining that accessing the second memory cell concurrently with programming the first memory cell is permitted. The operations of 1425 may be performed according to the methods described herein.

An apparatus for performing the method 1400 is described. The apparatus may include means for identifying a first memory cell of a memory tile to program using a write operation, means for identifying a second memory cell of the memory tile to access using a write operation or a read operation, means for determining that accessing the second memory cell concurrently with programming the first memory cell is permitted on the memory tile during an access operation duration, means for programming the first memory cell of the memory tile during the access operation duration, and means for accessing the second memory cell of the memory tile concurrently with programming the first memory cell during the access operation duration based at least in part on determining that accessing the second memory cell concurrently with programming the first memory cell is permitted.

In some examples of the method 1400 and apparatus described above, accessing the second memory cell concurrently with programming the first memory cell may further include processes, features, means, or instructions for programming the first memory cell using a first programming pulse during the access operation duration and programming the second memory cell using a second programming pulse during the access operation duration concurrently with programming the first memory cell.

Some examples of the method 1400 and apparatus described above may further include processes, features, means, or instructions for delaying an application of the first programming pulse or the second programming pulse during the access operation duration based at least in part on a voltage applied to an unselected memory cell exceeding a programming threshold on the memory tile during the access operation duration, wherein accessing the second memory cell concurrently with programming the first memory cell during the access operation duration may be based at least in part on delaying the first programming pulse.

Some examples of the method 1400 and apparatus described above may further include processes, features, means, or instructions for identifying a first bit transition of the first memory cell during the write operation and a second bit transition of the second memory cell during the write operation. Some examples of the method 1400 and apparatus described above may further include processes, features, means, or instructions for determining that a combination of the first bit transition and the second bit transition may be would result in a voltage applied to an unselected memory cell exceeding a programming threshold on the memory tile during the single access operation duration, wherein delaying the application of the first programming pulse or the second programming pulse may be based at least in part on determining that the combination of the first bit transition and the second bit transition would result in the voltage applied to the unselected memory cell exceeding the programming threshold.

Some examples of the method 1400 and apparatus described above may further include processes, features, means, or instructions for refraining from applying the first programming pulse or the second programming pulse during the single access operation duration based at least in part on a combination of the first programming pulse and the second programming pulse applying a voltage to an unselected memory cell that exceeds a programming threshold of the unselected memory cell.

Some examples of the method 1400 and apparatus described above may further include processes, features, means, or instructions for determining that the first memory cell may be coupled with different access lines than the second memory cell, wherein accessing the second memory cell concurrently with programming the first memory cell during the access operation duration may be based at least in part on determining that the first memory cell may be coupled with different access lines than the second memory cell.

In some examples of the method 1400 and apparatus described above, accessing the second memory cell concurrently with programming the first memory cell may further include processes, features, means, or instructions for programming the first memory cell using a programming pulse during the access operation duration and reading the second memory cell using a read pulse during the access operation duration concurrently with programming the first memory cell.

Some examples of the method 1400 and apparatus described above may further include processes, features, means, or instructions for selecting a polarity of the read pulse applied to the second memory cell during the access operation duration based at least in part on a characteristic of the programming pulse applied to the first memory cell during the access operation duration.

In some examples of the method 1400 and apparatus described above, the characteristic of the programming pulse may be a polarity of the programming pulse, a location to which the programming pulse may be being applied, a bit transition associated with the programming pulse, or a combination thereof.

Some examples of the method 1400 and apparatus described above may further include processes, features, means, or instructions for inverting data read from the second memory cell based at least in part on the read pulse having a negative polarity. Some examples of the method 1400 and apparatus described above may further include processes, features, means, or instructions for outputting the inverted data.

Some examples of the method 1400 and apparatus described above may further include processes, features, means, or instructions for delaying an application of the programming pulse or the read pulse during the access operation duration based at least in part on a voltage applied to an unselected memory cell exceeding a programming threshold on the memory tile during the access operation duration, wherein accessing the second memory cell concurrently with programming the first memory cell during the access operation duration may be based at least in part on delaying the programming pulse or the read pulse.

Some examples of the method 1400 and apparatus described above may further include processes, features, means, or instructions for determining that a combination of the programming pulse and the read pulse would result in a voltage applied to an unselected memory cell exceeding a programming threshold on the memory tile during the access operation duration, wherein delaying the programming pulse or the read pulse may be based at least in part on determining that the combination of the programming pulse and the read pulse would result in the voltage applied to the unselected memory cell exceeding the programming threshold.

Some examples of the method 1400 and apparatus described above may further include processes, features, means, or instructions for refraining from applying the programming pulse or the read pulse during the access operation duration based at least in part on a combination of the programming pulse and the read pulse applying a voltage to an unselected memory cell that exceeds a programming threshold of the unselected memory cell.

Some examples of the method 1400 and apparatus described above may further include processes, features, means, or instructions for determining that accessing the second memory cell concurrently with programming the first memory cell may be permitted may be based at least in part on the identifying that the voltage does not satisfy the programming threshold.

Some examples of the method 1400 and apparatus described above may further include processes, features, means, or instructions for determining that accessing the second memory cell concurrently with programming the first memory cell may be permitted may be based at least in part on the identifying that the voltage does not satisfy the programming threshold.

Some examples of the method 1400 and apparatus described above may further include processes, features, means, or instructions for determining that accessing the second memory cell concurrently with programming the first memory cell may be permitted may be based at least in part on the comparing the combination with the set.

Figure 15:
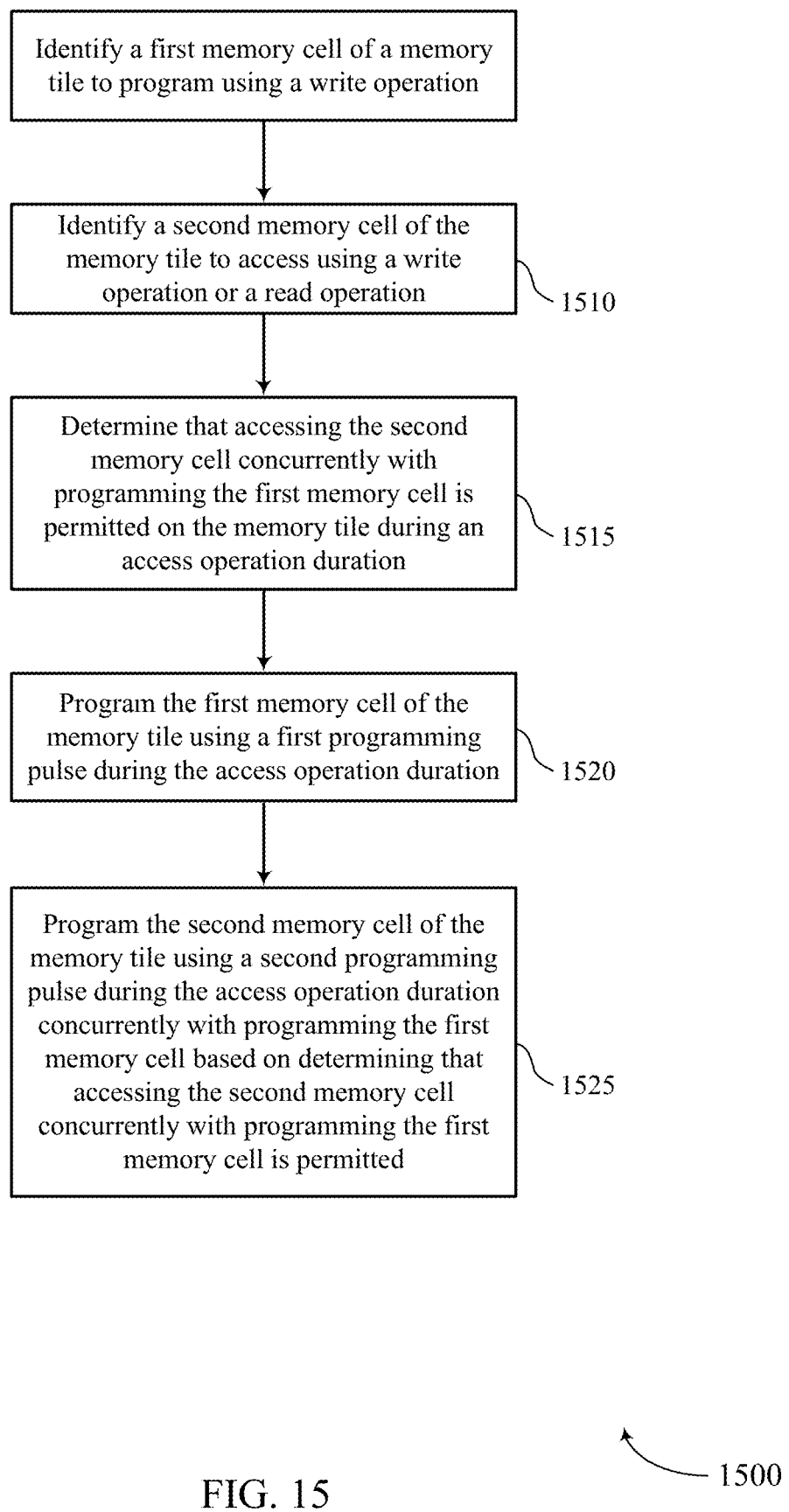

FIG. 15 shows a flowchart illustrating a method 1500 for system and techniques for accessing multiple memory cells concurrently in accordance with embodiments of the present disclosure. The operations of method 1500 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1505, the memory controller 140 may identify a first memory cell of a memory tile to program using a write operation. The operations of 1505 may be performed according to the methods described herein.

At block 1510, the memory controller 140 may identify a second memory cell of the memory tile to access using a write operation or a read operation. The operations of 1510 may be performed according to the methods described herein.

At block 1515, the memory controller 140 may determine that accessing the second memory cell concurrently with programming the first memory cell is permitted on the memory tile during an access operation duration. The operations of 1515 may be performed according to the methods described herein.

At block 1520, the memory controller 140 may program the first memory cell of the memory tile using a first programming pulse during the access operation duration. The operations of 1520 may be performed according to the methods described herein.

At block 1525, the memory controller 140 may program the second memory cell of the memory tile using a second programming pulse during the access operation duration concurrently with programming the first memory cell based at least in part on determining that accessing the second memory cell concurrently with programming the first memory cell is permitted. The operations of 1525 may be performed according to the methods described herein.

Figure 16:
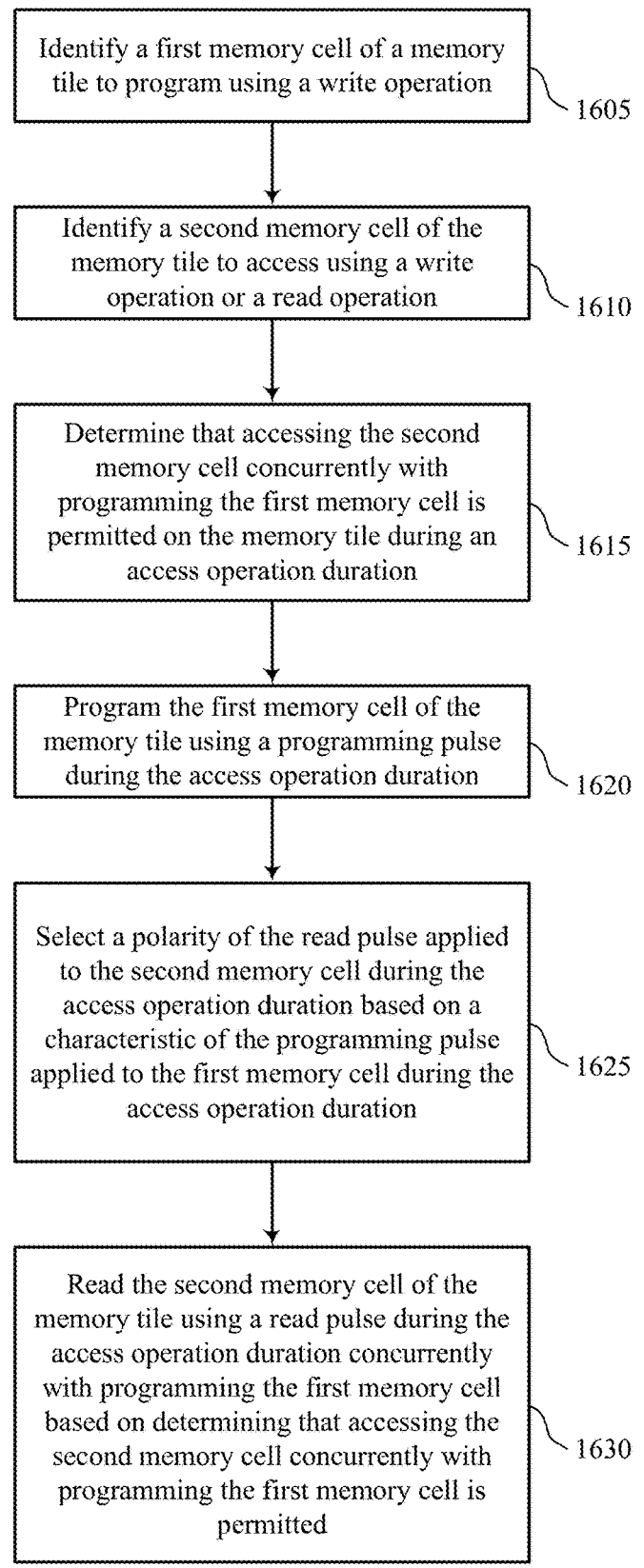

FIG. 16 shows a flowchart illustrating a method 1600 for system and techniques for accessing multiple memory cells concurrently in accordance with embodiments of the present disclosure. The operations of method 1600 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1605, the memory controller 140 may identify a first memory cell of a memory tile to program using a write operation. The operations of 1605 may be performed according to the methods described herein.

At block 1610, the memory controller 140 may identify a second memory cell of the memory tile to access using a write operation or a read operation. The operations of 1610 may be performed according to the methods described herein.

At block 1615, the memory controller 140 may determine that accessing the second memory cell concurrently with programming the first memory cell is permitted on the memory tile during an access operation duration. The operations of 1615 may be performed according to the methods described herein.

At block 1620, the memory controller 140 may program the first memory cell of the memory tile using a programming pulse during the access operation duration. The operations of 1620 may be performed according to the methods described herein.

At block 1625, the memory controller 140 may select a polarity of the read pulse applied to the second memory cell during the access operation duration based at least in part on a characteristic of the programming pulse applied to the first memory cell during the access operation duration. The operations of 1625 may be performed according to the methods described herein.

At block 1630, the memory controller 140 may read the second memory cell of the memory tile using a read pulse during the access operation duration concurrently with programming the first memory cell based at least in part on determining that accessing the second memory cell concurrently with programming the first memory cell is permitted. The operations of 1630 may be performed according to the methods described herein.

Figure 17:
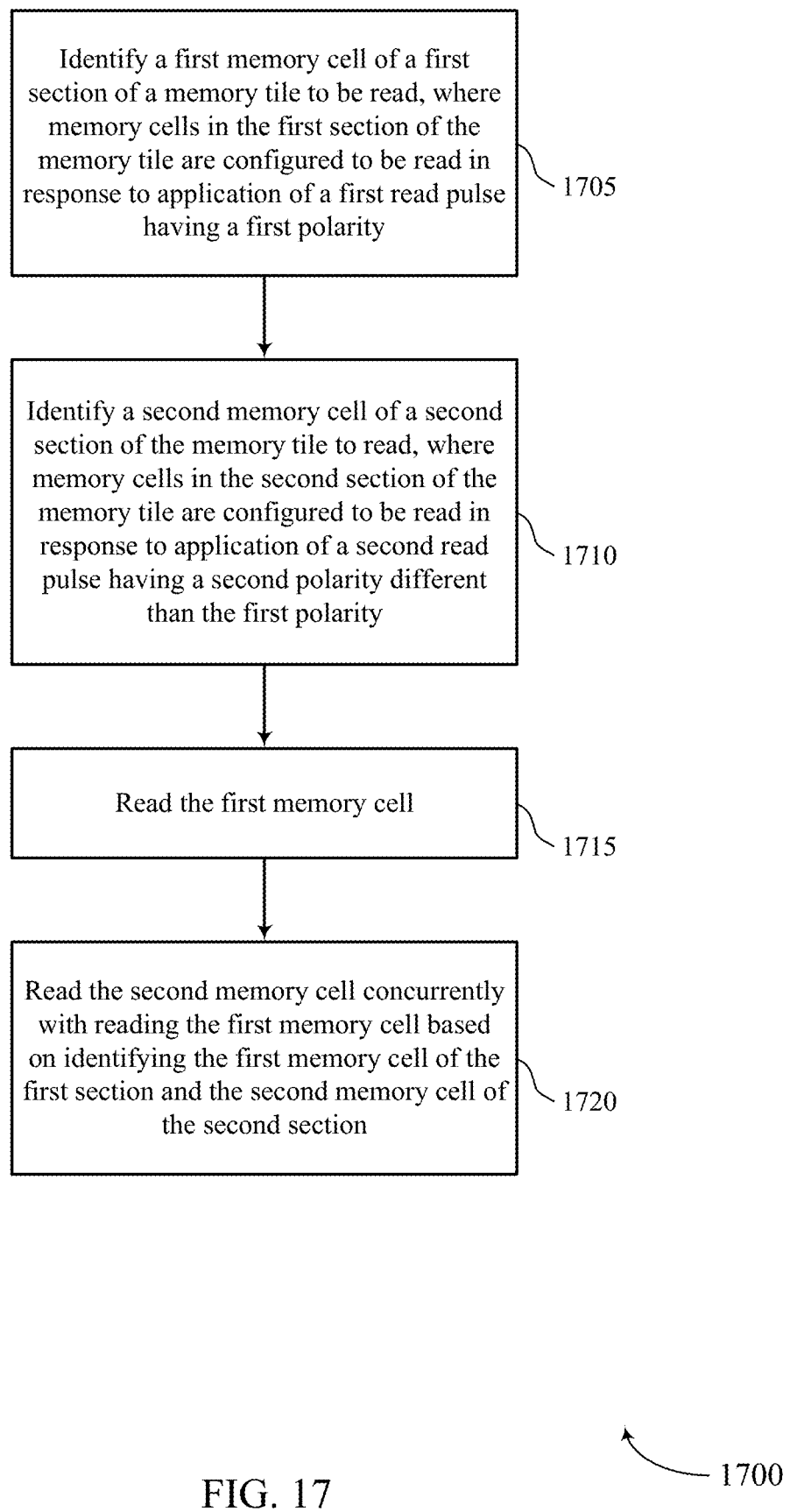

FIG. 17 shows a flowchart illustrating a method 1700 for system and techniques for accessing multiple memory cells concurrently in accordance with embodiments of the present disclosure. The operations of method 1700 may be implemented by a memory controller 140 or its components as described herein. In some examples, a memory controller 140 may execute a set of codes to control the functional elements of the memory device to perform the functions described below. Additionally or alternatively, the memory controller 140 may perform portions of the functions described below using special-purpose hardware.

At block 1705, the memory controller 140 may identify a first memory cell of a first section of a memory tile to be read, wherein memory cells in the first section of the memory tile are configured to be read in response to application of a first read pulse having a first polarity. The operations of 1705 may be performed according to the methods described herein.

At block 1710, the memory controller 140 may identify a second memory cell of a second section of the memory tile to read, wherein memory cells in the second section of the memory tile are configured to be read in response to application of a second read pulse having a second polarity different than the first polarity. The operations of 1710 may be performed according to the methods described herein.

At block 1715, the memory controller 140 may read the first memory cell. The operations of 1715 may be performed according to the methods described herein.

At block 1720, the memory controller 140 may read the second memory cell concurrently with reading the first memory cell based at least in part on identifying the first memory cell of the first section and the second memory cell of the second section. The operations of 1720 may be performed according to the methods described herein.

An apparatus for performing the method 1700 is described. The apparatus may include means for identifying a first memory cell of a first section of a memory tile to be read, wherein memory cells in the first section of the memory tile are configured to be read in response to application of a first read pulse having a first polarity, means for identifying a second memory cell of a second section of the memory tile to read, wherein memory cells in the second section of the memory tile are configured to be read in response to application of a second read pulse having a second polarity different than the first polarity, means for reading the first memory cell, and means for reading the second memory cell concurrently with reading the first memory cell based at least in part on identifying the first memory cell of the first section and the second memory cell of the second section.

Some examples of the method 1700 and apparatus described above may further include processes, features, means, or instructions for determining that the first memory cell may be coupled with different access lines than the second memory cell, wherein reading the second memory cell concurrently with reading the first memory cell may be based at least in part on determining that the first memory cell may be coupled with different access lines than the second memory cell.

Some examples of the method 1700 and apparatus described above may further include processes, features, means, or instructions for applying a first voltage having the first polarity to a first digit line coupled with the first memory cell based at least in part on the first read pulse having the first polarity. Some examples of the method 1700 and apparatus described above may further include processes, features, means, or instructions for applying a second voltage having the second polarity to a second digit line coupled with the second memory cell based at least in part on the second read pulse having the second polarity.

Some examples of the method 1700 and apparatus described above may further include processes, features, means, or instructions for applying a first voltage having the second polarity to a first digit line coupled with the first memory cell based at least in part on the first read pulse having the first polarity. Some examples of the method 1700 and apparatus described above may further include processes, features, means, or instructions for applying a second voltage having the first polarity to a second digit line coupled with the second memory cell based at least in part on the second read pulse having the second polarity.

In some examples of the method 1700 and apparatus described above, the first polarity may be opposite the second polarity such that the first section of memory cells may be configured to be read with a positive polarity read pulse and the second section of memory cells may be configured to read with a negative polarity read pulse.

An electronic memory apparatus is described. The apparatus may include a memory cell, a digit line coupled with the memory cell, a first sense component coupled with the digit line, the first sense component configured to identify a logic state stored on the memory cell based at least in part on a first read pulse having a first polarity and a second sense component coupled with the digit line, the second sense component configured to identify the logic state stored on the memory cell based at least in part on a second read pulse having a second polarity different than the first polarity.

In some examples, the apparatus may include a first voltage source coupled with the digit line, the first voltage source configured to supply at least a part of the first read pulse having the first polarity and a second voltage source coupled with the digit line, the second voltage source configured to supply at least a part of the second read pulse having the second polarity. In some examples, the apparatus may include a switching component configured to selectively couple the digit line with the first voltage source or the second voltage source during an access operation.

In some examples, the apparatus may include a switching component configured to selectively output a signal from the first sense component or the second sense component based at least in part on a type of read pulse applied to the memory cell during a read operation. In some examples, the memory cell comprises a chalcogenide material configured to use a non-uniform distribution of ions to indicate the logic state. In some examples, the memory cell is a self-selecting memory cell.

An electronic memory apparatus is described. In some examples, the apparatus may include a memory tile having a first section of memory cells and a second section of memory cells, wherein the memory cells of the first section are configured to be read in response to application of a first read pulse having a first polarity and the memory cells of the second section are configured to be read in response to application of a second read pulse having a second polarity different than the first polarity, a first sense component coupled with the first section of memory cells of the memory tile and configured to identify a logic state of one memory cell of the first section of memory cells based at least in part on the first read pulse having the first polarity, and a second sense component coupled with the second section of memory cells of the memory tile and configured to identify the logic state of one memory cell of the second section of memory cells based at least in part on the second read pulse having the second polarity.

In some examples, the apparatus may include a first voltage source coupled with digit lines of the first section, the first voltage source configured to supply at least a portion of the first read pulse having the first polarity and a second voltage source coupled with digit lines of the second section, the second voltage source configured to supply at least a portion of the second read pulse having the second polarity. In some examples, a memory cell of the memory tile is formed of a chalcogenide material configured to use a non-uniform distribution of ions to indicate the logic state.

In some examples, one or more trim parameters for the first section of memory cells are independent from one or more trim parameters for the second section of memory cells. In some examples, the first sense component and the second sense component are position under a footprint of the memory tile. In some examples, the memory tile includes more than one deck of memory cells.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory tile 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digit signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A method, comprising:
   identifying a first memory cell of a memory tile to read;
   identifying a second memory cell of the memory tile to read;
   selecting a first polarity of a first read pulse to read the first memory cell and a second polarity of a second read pulse to read the second memory cell;
   reading the first memory cell using the first read pulse; and
   reading the second memory cell using the second read pulse concurrently with reading the first memory cell based at least in part on selecting the first polarity and the second polarity.

2. The method of claim 1, wherein the first polarity of the first read pulse is opposite the second polarity of the second read pulse.

3. The method of claim 1, further comprising:
   applying voltages to access lines coupled with the first memory cell and the second memory cell concurrently based at least in part on selecting the first polarity and the second polarity, wherein reading the second memory cell concurrently with the first memory cell is based at least in part on applying the voltages to the access lines.

4. The method of claim 3, further comprising:
   partitioning the first read pulse into a first voltage to apply to a first access line and a second voltage to apply to a second access line, the first access line and the second access line coupled with the first memory cell;
   identifying a magnitude and a polarity of the first voltage based at least in part on the first polarity of the first read pulse; and
   identifying, based at least in part on the first polarity of the first read pulse and the first voltage, a magnitude of the second voltage different than the magnitude of the first voltage and a polarity of the second voltage different than the polarity of the first voltage, wherein applying the voltages is based at least in part on the partitioning and the identifying.

5. The method of claim 1, further comprising:
   identifying a first logic state stored on the first memory cell and a second logic state stored on the second memory cell based at least in part on reading the second memory cell concurrently with reading the first memory cell.

6. The method of claim 1, further comprising:
   coupling the first memory cell to a first type of sense component based at least in part on the first read pulse having the first polarity; and coupling the second memory cell to a second type of sense component different than the first type based at least in part on the second read pulse having the second polarity.

7. The method of claim 1, wherein the first polarity and the second polarity are selected such that a voltage difference caused by the first read pulse or the second read pulse at a third memory cell of the memory tile does not satisfy a programming threshold of the third memory cell.

8. The method of claim 1, further comprising:
determining that the first memory cell and the second memory cell are coupled with a common access line, wherein the first polarity and the second polarity are the same based at least in part on determining that the first memory cell and the second memory cell are coupled with the common access line.

9. An electronic memory apparatus, comprising:
a memory cell;
a digit line coupled with the memory cell;
a first sense component coupled with the digit line, the first sense component configured to identify a logic state stored on the memory cell based at least in part on a first read pulse having a first polarity; and
a second sense component coupled with the digit line, the second sense component configured to identify the logic state stored on the memory cell based at least in part on a second read pulse having a second polarity different than the first polarity.

10. The electronic memory apparatus of claim 9, further comprising:
a first voltage source coupled with the digit line, the first voltage source configured to supply at least a part of the first read pulse having the first polarity; and
a second voltage source coupled with the digit line, the second voltage source configured to supply at least a part of the second read pulse having the second polarity.

11. The electronic memory apparatus of claim 10, further comprising:
a switching component configured to selectively couple the digit line with the first voltage source or the second voltage source during an access operation.

12. The electronic memory apparatus of claim 9, further comprising:
a switching component configured to selectively output a signal from the first sense component or the second sense component based at least in part on a type of read pulse applied to the memory cell during a read operation.

13. The electronic memory apparatus of claim 9, wherein the memory cell comprises a chalcogenide material configured to use a non-uniform distribution of ions to indicate the logic state.

14. The electronic memory apparatus of claim 9, wherein the memory cell is a self-selecting memory cell.

* * * * *